US012075677B2

(12) United States Patent
Hyun et al.

(10) Patent No.: US 12,075,677 B2
(45) Date of Patent: Aug. 27, 2024

(54) DISPLAY PANEL AND DISPLAY DEVICE

(71) Applicant: SAMSUNG DISPLAY CO., LTD., Yongin-si (KR)

(72) Inventors: Chang Ho Hyun, Seoul (KR); Dohyun Kang, Hwaseong-si (KR); Byung Wook Ahn, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 63 days.

(21) Appl. No.: 17/138,974

(22) Filed: Dec. 31, 2020

(65) Prior Publication Data

US 2021/0327971 A1    Oct. 21, 2021

(30) Foreign Application Priority Data

Apr. 16, 2020 (KR) .......................... 10-2020-0046208

(51) Int. Cl.
*H10K 59/35* (2023.01)
*H10K 59/122* (2023.01)

(52) U.S. Cl.
CPC ......... *H10K 59/353* (2023.02); *H10K 59/122* (2023.02); *H10K 59/352* (2023.02)

(58) Field of Classification Search
CPC .... H01L 27/3216–3218; H10K 59/352; H10K 59/353; H10K 59/122
See application file for complete search history.

(56) References Cited

U.S. PATENT DOCUMENTS

| | | | |
|---|---|---|---|
| 9,185,277 B2 | 11/2015 | Lee et al. | |
| 9,312,312 B1 | 4/2016 | Tsai et al. | |
| 9,648,216 B2 | 5/2017 | Yoo et al. | |
| 2018/0277040 A1* | 9/2018 | Lee | H01L 51/5203 |
| 2019/0051708 A1* | 2/2019 | Jeong | H01L 27/323 |
| 2020/0111401 A1* | 4/2020 | Zhao | G09G 3/2003 |
| 2020/0194730 A1* | 6/2020 | Park | H01L 27/3218 |
| 2021/0041923 A1* | 2/2021 | Bai | G06F 1/189 |
| 2021/0065625 A1* | 3/2021 | Wang | H10K 59/35 |

FOREIGN PATENT DOCUMENTS

| | | |
|---|---|---|
| JP | 2010-230797 | 10/2010 |
| KR | 1020140125029 | 10/2014 |
| KR | 10-1632311 | 6/2016 |

\* cited by examiner

*Primary Examiner* — Eric K Ashbahian
(74) *Attorney, Agent, or Firm* — F. Chau & Associates, LLC

(57) ABSTRACT

Disclosed are display layers, panels and devices. The display panel has a first display region and a second display region, at least a portion of which is bounded by the first display region, a plurality of first pixels on the first display region, and a plurality of second pixels on the second display region and including a plurality of light-emitting pixels each providing the same color as that produced from one of the first pixels and a plurality of non-light-emitting pixels. A first region where the light-emitting pixels are disposed is asymmetric to a second region where the non-light-emitting pixels are disposed.

31 Claims, 16 Drawing Sheets

DISPLAY PANEL AND DISPLAY DEVICE

CROSS-REFERENCE TO RELATED APPLICATION

This U.S. non-provisional application claims priority under 35 U.S.C. § 119 to Korean Patent Application No. 10-2020-0046208 filed on Apr. 16, 2020 in the Korean Intellectual Property Office, the disclosure of which is hereby incorporated by reference in its entirety.

FIELD

The present inventive concept relates to display panels and display devices, and more particularly, to a display device with electronic module of high sensitivity.

DISCUSSION OF RELATED ART

A display device may consist of various electronic components such as a display panel that displays images, an input sensing member that detects external inputs, and an electronic module. The electronic components may be electrically connected to each other through diversely arranged signal lines. The display panel may include a light-emitting element that generates light. The input sensing member may include sensing electrodes for detection of external inputs. The electronic module may include a camera, an infrared sensor, a proximity sensor, or the like. The electronic module may be disposed below the display panel.

SUMMARY

Some embodiments of the present inventive concept provide a display panel and a display device that increase sensitivity of an electronic module and decrease diffraction of light generated from pixels.

According to some embodiments of the present inventive concept, a display panel may comprise: a first display region and a second display region adjacent to the first display region; a plurality of first pixels on the first display region, the first pixels including at least one transistor and a light-emitting element connected to the transistor; and a plurality of second pixels on the second display region, the second pixels including a plurality of light-emitting pixels and a plurality of non-light-emitting pixels. The light-emitting pixels may provide a color the same as a color produced from one of the first pixels. The non-light-emitting pixels may be defined by the absence of one of the transistor and/or the light-emitting element. A transmission cell may be defined by multiplication of the number of row pixels arranged in a first direction among the second pixels and the number of column pixels arranged in a second direction among the second pixels. The second direction may intersect the first direction. On the transmission cell, the light-emitting pixels may bound or partially surround the non-light-emitting pixels and have different numbers along the first direction and the second direction.

In some embodiments, on the transmission cell, a ratio of the non-light-emitting pixels to the second pixels may be in a range between about ½ and about ⅗.

In some embodiments, the number of row pixels may be about six. The number of column pixels may be in a range between about 4 and about 6.

In some embodiments, the transmission cell may be provided in a plurality. The transmission cells may be arranged along the first direction and the second direction.

In some embodiments, the transmission cells may include a first transmission cell and a second transmission cell that are arranged along the second direction. The second transmission cell may be spaced apart in the first direction from the first transmission cell at a distance corresponding to sizes of some of the light-emitting pixels.

In some embodiments, each of the light-emitting pixels may be defined as a light-emitting unit. The light-emitting unit may include first, second, and third sub-pixels having light-emitting areas different from each other.

In some embodiments, the first, second, and third sub-pixels may be disposed in a diamond shape.

In some embodiments, each of the light-emitting pixels may be defined as a light-emitting unit. The light-emitting unit may include first and second sub-pixels having light-emitting areas different from each other.

In some embodiments, on the transmission cell, the non-light-emitting pixels may have different numbers along the first direction and the second direction.

In some embodiments, at least a portion of the second display region may be surrounded by the first display region.

According to some embodiments of the present inventive concept, a display device may comprise: a display panel that is divided into a first display region and a second display region adjacent to the first display region, wherein the display panel includes a plurality of first pixels on the first display region and a plurality of second pixels on the second display region, the first pixels including at least one transistor and a light-emitting element connected to the transistor, the second pixels including a plurality of light-emitting pixels each of which provides a color the same as a color produced from one of the first pixels and a plurality of non-light-emitting pixels each of which is defined by the absence of one of the transistor and the light-emitting element; and an electronic module below the display panel and underlying the second display region. A transmission cell may be defined by multiplication of the number of row pixels arranged in a first direction among the second pixels and the number of column pixels arranged in a second direction among the second pixels. The second direction may intersect the first direction. On the transmission cell, the light-emitting pixels may surround the non-light-emitting pixels and have different numbers along the first direction and the second direction.

In some embodiments, on the transmission cell, a ratio of the non-light-emitting pixels to the second pixels may be in a range between about ½ and about ⅗.

In some embodiments, the number of row pixels may be about six. The number of column pixels may be in a range between about 4 and about 6.

In some embodiments, the transmission cell may be provided in a plurality. The transmission cells may be arranged along the first direction and the second direction.

In some embodiments, the transmission cells may include a first transmission cell and a second transmission cell that are arranged along the second direction. The second transmission cell may be spaced apart in the first direction from the first transmission cell at a distance corresponding to sizes of some of the light-emitting pixels.

In some embodiments, each of the light-emitting pixels may be defined as a light-emitting unit. The light-emitting unit may include first, second, and third sub-pixels having light-emitting areas different from each other.

In some embodiments, the first, second, and third sub-pixels may be disposed in a diamond shape.

In some embodiments, on the transmission cell, the non-light-emitting pixels may have different numbers along the first direction and the second direction.

In some embodiments, at least a portion of the second display region may be surrounded by the first display region.

In some embodiments, the electronic module may include at least one selected from an acoustic output module, a light-emitting module, a light receiving module, and a camera module.

According to some embodiments of the present inventive concept, a display layer includes a circuit element layer having first light-emitting elements of a first emitter type and second light-emitting elements of a second emitter type; a sensing circuit layer overlapping the circuit element layer and having non-light-emitting elements of a sensor type; and a pixel definition layer overlapping the circuit element layer and the sensing circuit layer, and having first openings defining first light-emitting pixels on the first light-emitting elements of the first emitter type, second openings defining second light-emitting pixels on the second light-emitting elements of the second emitter type, and sensor openings defining non-light-emitting pixels on the non-light-emitting elements.

In some embodiments, each non-light-emitting pixel is bounded on at least two sides by other immediately adjacent non-light-emitting pixels, and bounded on no more than two sides by immediately adjacent light-emitting pixels, where a ratio of a quantity of the non-light-emitting pixels to a sum of the quantities of the non-light-emitting pixels plus the light-emitting pixels is between about ½ and about ⅗. In some embodiments, the display layer may include an electronic module including the non-light-emitting elements disposed under at least one of the non-light-emitting pixels, wherein the sensor type is responsive to infrared light. In some embodiments, the display layer may include a transmission cell including a heterogenous array of light-emitting pixels disposed around a periphery of non-light-emitting pixels arranged in a number of rows of a first direction and a different number of columns of a second direction intersecting the first direction, where each non-light-emitting pixel is bounded on at least two sides by other immediately adjacent non-light-emitting pixels, where a non-zero and non-unitary ratio of a quantity of non-light-emitting pixels to all pixels is different along each of the rows versus each of the columns, where a ratio of the quantity of non-light-emitting pixels to total pixels in the transmission cell is in a range from about ½ to about ⅗.

In some embodiments, the circuit element layer has third light-emitting elements of a third emitter type, and the pixel definition layer has third openings defining third light-emitting pixels on the third light-emitting elements, where the first emitter type is configured to emit red light, the second emitter type is configured to emit green light, and the third emitter type is configured to emit blue light, where sizes of the first, second, and third openings are different from each other. In some embodiments, the size of the first openings is larger than the size of the second openings and smaller than the size of the third openings, where sizes of the sensor openings are greater than or equal to the sizes of at least one of the first, second, or third openings. In some embodiments, a quantity of the first light-emitting pixels is substantially equal to a quantity of the third light-emitting pixels, where a quantity of the second light-emitting pixels is substantially equal to a sum of the quantity of the first light-emitting pixels and the quantity of the third light-emitting pixels.

In some embodiments, the display layer may include an electronic module including the non-light-emitting elements disposed under a plurality of the non-light-emitting pixels, wherein the sensor type comprises at least three sensor types responsive to at least red light, green light, and blue light, respectively. In some embodiments, the first openings are oriented substantially the same as each other, where the third openings are oriented substantially the same as each other, where the second openings are oriented in a first direction where disposed on a diagonal of adjacent pixels comprising the first openings, and oriented in a second direction where disposed on a diagonal of adjacent pixels comprising the second openings. In some embodiments, the second openings are elongated on one axis and oriented with the elongated axis disposed on a diagonal of adjacent first openings.

DETAILED DESCRIPTION

Figure 1A:
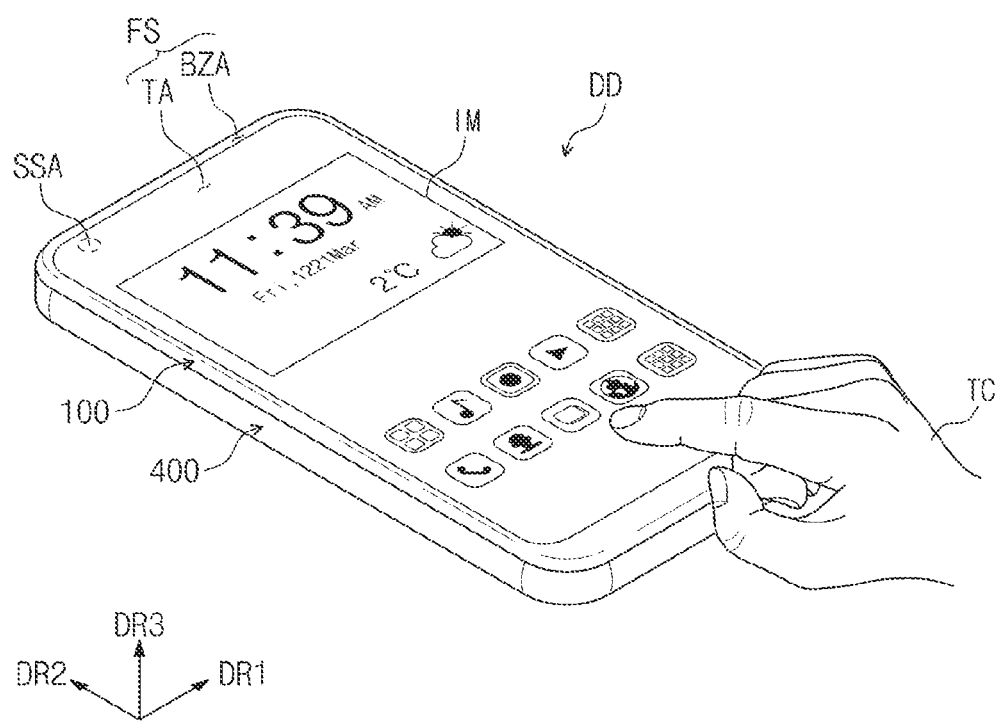
FIG. 1A is a perspective diagram showing a display device according to an exemplary embodiment of the present inventive concept.

In this description, when a certain component (or region, layer, portion, or the like) is referred to as being "on", "connected to", or "coupled to" other component(s), the certain component may be directly disposed on, directly connected to, or directly coupled to the other component(s) or at least one intervening component may be present therebetween.

Like numerals may indicate like components. Moreover, in the drawings, thicknesses, ratios, and dimensions of components may be exaggerated for effectively explaining the technical contents.

The term "and/or" includes one or more combinations defined by associated components.

It will be understood that, although the terms first, second, or the like, may be used herein to describe various components, these components should not be limited by these terms. These terms are used to distinguish one component from another component. For example, a first component could be termed a second component, and vice versa, without departing from the scope of the present inventive concept. Unless the context clearly indicates otherwise, the singular forms are intended to include the plural forms as well.

In addition, the terms "beneath", "lower", "above", "upper", and the like are used herein to describe one component's relationship to other component(s) illustrated in the drawings. The relative terms are intended to encompass different orientations in addition to the orientation depicted in the drawings.

Unless otherwise defined, all terms used herein including technical and scientific terms have the same meaning generally understood by one of ordinary skilled in the art. Also, terms as defined in generally used dictionaries should be understood as having the defined meaning or the meaning contextually defined in the art, and should not be understood as having an ideally or excessively formal meaning unless specifically stated herein.

It should be understood that the terms "comprise", "include", "have", and the like are used to specify the presence of stated features, integers, steps, operations, components, elements, or combinations thereof, but do not preclude the presence or addition of one or more other features, integers, steps, operations, components, elements, or combinations thereof. The following will now describe exemplary embodiments of the present inventive concept in conjunction with the accompanying drawings.

Figure 1B:
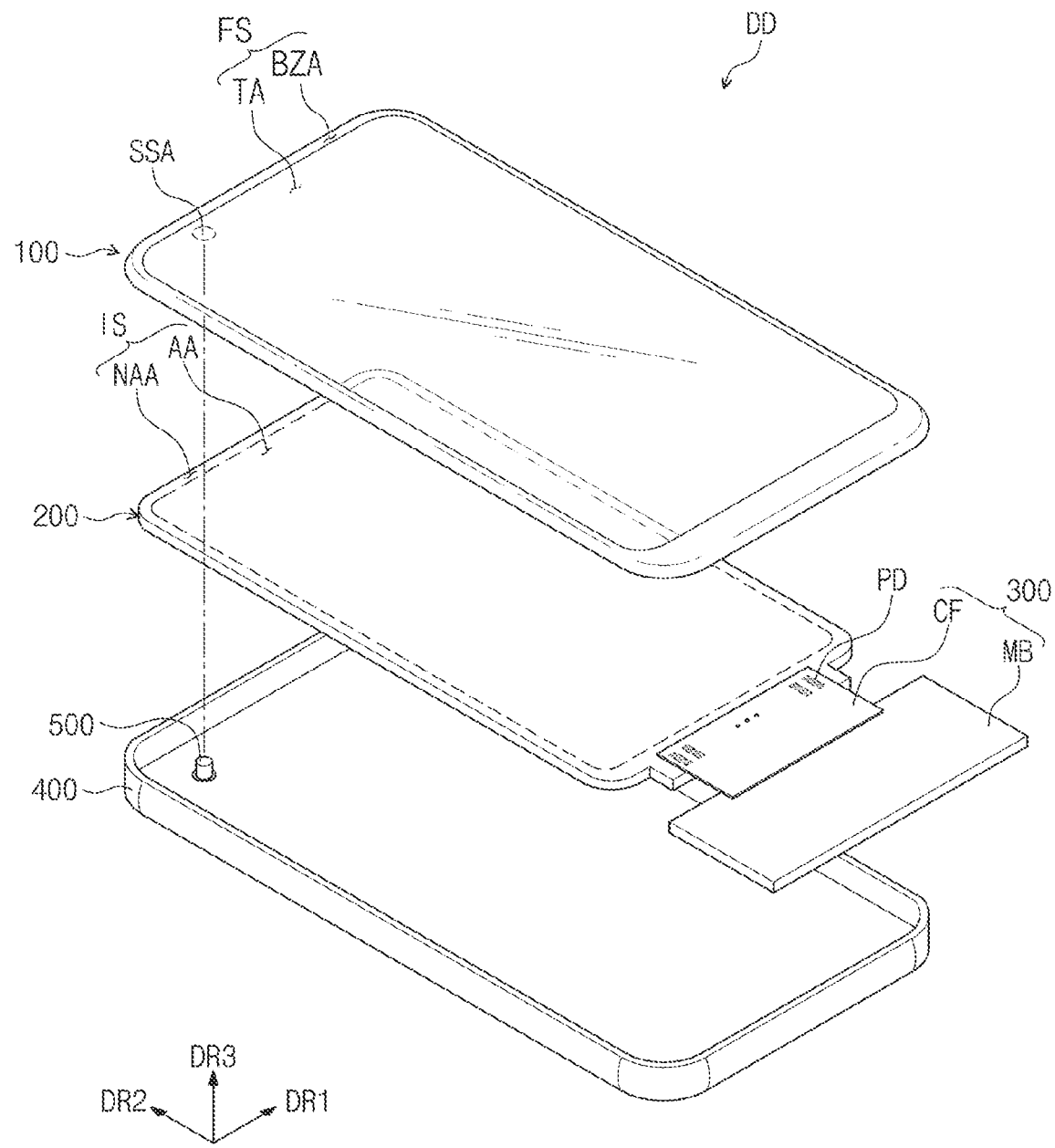
FIG. 1B is an exploded perspective diagram showing a display device according to an exemplary embodiment of the present inventive concept.
Figure 2:
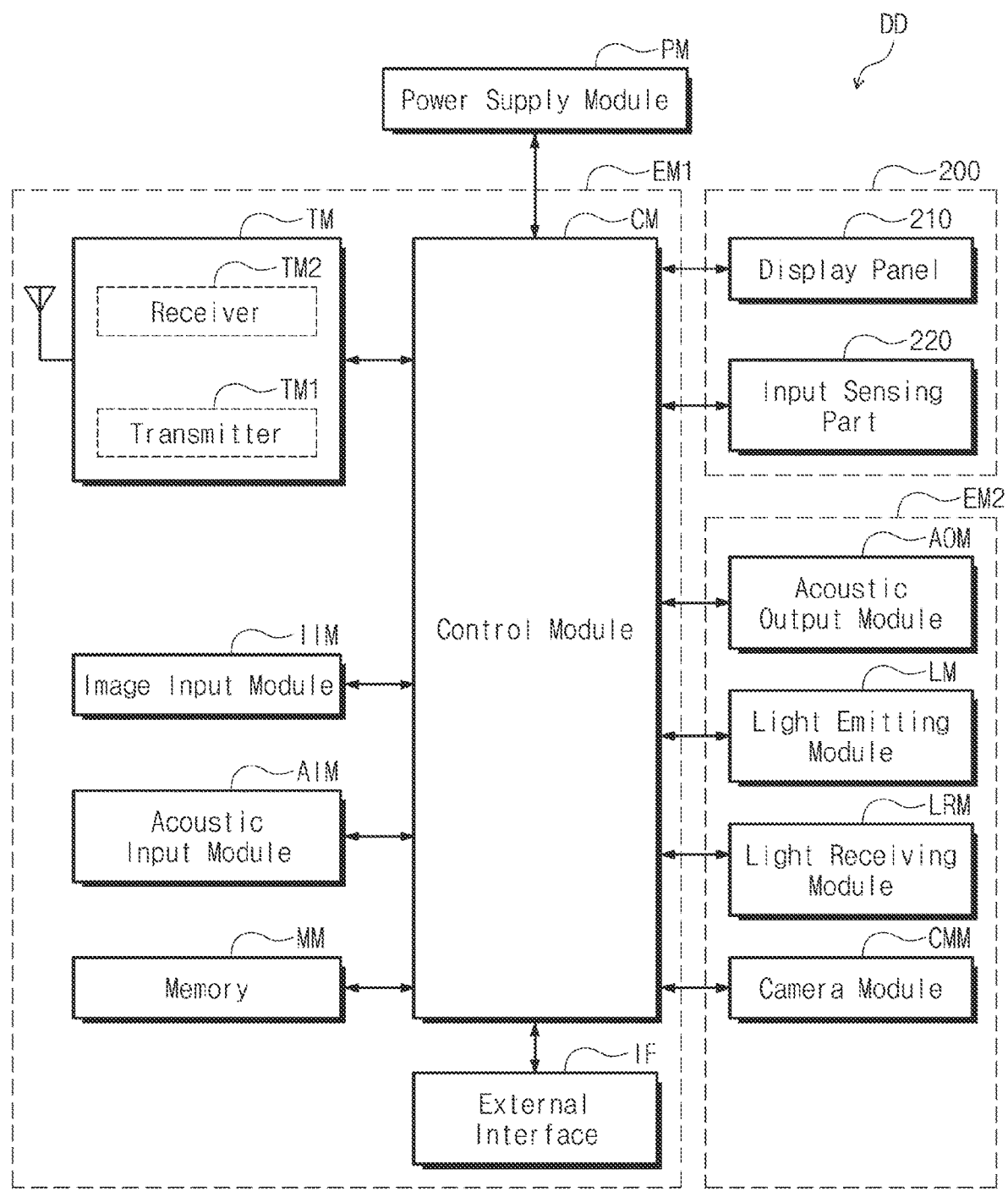
FIG. 2 is a block diagram showing a display device according to an exemplary embodiment of the present inventive concept.

FIG. 1A illustrates a display device according to an exemplary embodiment of the present inventive concept. FIG. 1B illustrates a display device according to an exemplary embodiment of the present inventive concept. FIG. 2 illustrates a display device according to an exemplary embodiment of the present inventive concept.

A display device DD may be an apparatus activated based on electrical signals. The display device DD may be realized in various embodiments. The display device DD may include, for example, a tablet computer, a laptop computer, or a television set. In an exemplary embodiment, a smart phone is illustrated, by way of example, as the display device DD, without limitation thereto.

As shown in FIG. 1, the display device DD may display an image IM in a third direction DR3 perpendicular to a display surface FS that is substantially parallel to a plane defined by each of a first direction DR1 and a second direction DR2. The display surface FS on which the image IM is displayed may correspond to a front surface of the display device DD and to a front surface of a window 100. The same reference symbol FS may be allocated to the display surface of the display device DD, the front surface of the display device DD, and the front surface of the window 100. The image IM may include not only dynamic images but also static images. FIG. 1A shows a clock window and application icons as examples of the image IM, without limitation.

In this description, front and rear surfaces (or top and bottom surfaces) of each member are defined based on a direction along which the image IM is displayed. The front and rear surfaces may be opposite to each other in the third direction DR3, and a normal direction to each of the front and rear surfaces may be parallel to the third direction DR3. Directions indicated by the first, second, and third directions DR1, DR2, and DR3 are relative concepts and may denote other directions.

Turning to FIG. 1B, the display device DD may include a window 100, a display module 200, a drive circuit part 300, a housing 400, and an electronic module 500. In an exemplary embodiment, the window 100 and the housing 400 may be combined with each other to constitute an appearance of the display device DD.

The window 100 may include an optically transparent dielectric material. For example, the window 100 may include glass or plastic. The window 100 may have a single-layered or multi-layered structure. For example, the window 100 may include either a plurality of plastic films that are coupled together through an adhesive, or a glass substrate and a plastic film that are coupled together through an adhesive.

When viewed on a plane, the window 100 may be divided into a transmission region TA and a bezel region BZA. In this description, the phrase "when viewed on a plane" may mean when viewed in the third direction DR3 without regard to sign. In addition, "a thickness direction" may denote the third direction DR3 or its opposite direction.

The transmission region TA may be an optically transparent zone. The bezel region BZA may be a zone having an optical transmittance relatively lower than that of the transmission region TA. The bezel region BZA may define a shape of the transmission region TA. The bezel region BZA may be adjacent to, and may surround, the transmission region TA.

The bezel region BZA may have a certain color. The bezel region BZA may cover a peripheral region NAA of the display module 200 and may prevent the peripheral region NAA from being externally visible. This configuration, however, is illustrated by way of example, and the bezel region BZA may be omitted from the window 100 according to an alternate embodiment of the present inventive concept.

In an exemplary embodiment of the present inventive concept, a sensing region SSA may be a zone that overlaps the electronic module 500 which will be discussed below.

The display device DD may receive through the sensing region SSA external signals required for the electronic module 500, or may provide signals output from the electronic modules 500 to the outside.

According to an exemplary embodiment of the present inventive concept, the sensing region SSA may be defined to overlap the transmission region TA. Therefore, a separate region required to provide for the sensing region SSA may be omitted from a region other than the transmission region TA, or from the bezel region BZA. As a result, the bezel region BZA may decrease in area.

Although FIG. 1B depicts by way of example one sensing region SSA, the present inventive concept is not limited thereto. For example, two or more sensing regions SSA may be defined depending on how the electronic module 500 is used. In addition, FIG. 1B depicts by way of example that the sensing region SSA is defined on a left top portion of the transmission region TA, but the sensing region SSA may be defined on a right top portion, a central portion, a left bottom portion, a right bottom portion, or any other portion of the transmission region TA. Alternatively, when the sensing region SSA is provided in a plurality, one of the plurality of sensing regions SSA may be defined on a left top portion of the transmission region TA, and another of the plurality of sensing regions SSA may be defined on a right top portion of the transmission region TA.

The display module 200 may be disposed below the window 100. In this description, the term "below" may mean a direction opposite to a direction along which the display module 200 provides an image, such as the direction DR3. The display module 200 may display the image IM and detect an external input TC of FIG. 1A. The display module 200 includes a front surface IS including an active region AA and a peripheral region NAA. The active region AA may be a zone activated with an electric signal.

In an exemplary embodiment, the active region AA may be a zone to display the image IM, and may also be a zone to detect the external input TC. The transmission region TA may overlap at least the active region AA. For example, the transmission region TA may partially or entirely overlap the active region AA. Accordingly, a user may recognize the image IM through the transmission region TA, and/or may provide the external input TC through the transmission region TA.

The peripheral region NAA may be a zone covered with the bezel region BZA. The peripheral region NAA is adjacent to the active region AA. The peripheral region NAA may surround the active region AA. The peripheral region NAA may include a drive line or a drive circuit for driving the active region AA.

In an exemplary embodiment, the display module 200 is assembled such that the active region AA and the peripheral region NAA have surfaces in flat states facing the window 100. This configuration, however, is illustrated by way of example, and a portion of the peripheral region NAA may be curved. In this case, the curved portion of the peripheral region NAA may be directed toward a rear surface of the display device DD, and thus the bezel region BZA may have a reduced area on the front surface of the display device DD. Alternatively, the display module 200 may be assembled such that a portion of the active region AA is configured with its surface in a bending state. The peripheral region NAA may be omitted from the display module 200 according to an alternate embodiment of the present inventive concept.

The drive circuit part 300 may be electrically connected to the display module 200. The drive circuit part 300 may include a main circuit board MB and a flexible film CF.

The flexible film CF is electrically connected to the display module 200. The flexible film CF may be coupled to pads of the display module 200 that are disposed on the peripheral region NAA. The flexible film CF provides the display module 200 with electrical signals for driving the display module 200. The electrical signals may be generated from the flexible film CF or the main circuit board MB. The main circuit board MB may include a connector for supplying power or include various drive circuits for driving the display module 200.

In an exemplary embodiment of the present inventive concept, on the display module 200, a zone of the active region AA corresponding to the overlying sensing region SSA may have transmittance relatively greater than transmittance of a zone of the active region AA corresponding to the overlying portion of the transmission region TA that does not overlap the electronic module 500. In an alternate embodiment, at least one among components of the display module 200 may be absent. Accordingly, the electronic module 500 may easily transfer and/or receive signals through the sensing region SSA.

The electronic module 500 may be disposed below the display module 200. In an exemplary embodiment, the electronic module 500 may be placed below the active region AA of the display module 200. The electronic module 500 may receive external inputs transferred through the sensing region SSA and/or may provide outputs through the sensing region SSA.

The housing 400 is coupled to the window 100. The housing 400 and the window 100 may be combined with each other to provide an inner space. The inner space may accommodate the display module 200, the drive circuit part 300, and the electronic module 500.

The housing 400 may include a material whose rigidity is relatively high. For example, the housing 400 may include glass, plastic, or metal, or may include a plurality of frames and/or plates consisting of any combination of glasses, plastics, and/or metals. The housing 400 may stably protect, from external impact, components of the display device DD that are accommodated in the inner space.

Referring to FIG. 2, the display device DD may include a display module 200, a power supply module PM, a first electronic module EM1, and a second electronic module EM2. The display module 200, the power supply module PM, the first electronic module EM1, and the second electronic module EM2 may be electrically connected to each other. The first electronic module EM1, and/or the second electronic module EM2, may be configured as the electronic module 500 of FIG. 1B, for example.

The display module 200 may include a display panel 210 and an input sensing part 220.

The display panel 210 may be a component that substantially generates the image IM. The image IM generated from the display panel 210 may be displayed on the front surface IS, and a user may externally recognize the image IM through the transmission region TA of FIGS. 1A and 1B.

The input sensing part 220 may be comprised by the electronic module 500 and detect the external input TC of FIG. 1A that is externally applied. For example, the input sensing part 220 may detect the external input TC that is provided to the window 100. The external input TC may be a user's input. The user's input may include input by a user's body part, light, heat, pen, pressure, or any suitable types of external input as presently known or implemented in the future. In an exemplary embodiment, the external input TC may be a result of a user's hand or finger being applied to the front surface FS. This, however, is only an example, and the external input TC may be provided in various types as discussed above. Depending on a structure of the display device DD, the display device DD may detect the external input TC that is applied to a lateral or rear surface of the display device DD, but the present inventive concept is not limited to a particular embodiment.

The power supply module PM supplies power required for overall operation of the display device DD. The power supply module PM may include a battery module, for example.

The first electronic module EM1 and the second electronic module EM2 may include diverse functional modules for operating the display device DD.

The first electronic module EM1 may be directly mounted on a motherboard electrically connected to the display module 200, or may be mounted on a separate board that is electrically connected to the motherboard through connectors or the like.

The first electronic module EM1 may include a control module CM, a wireless communications module TM, an image input module IIM, an acoustic input module AIM, a memory MM, and/or an external interface IF. One or more of the modules mentioned above need not be mounted on the motherboard, but may be electrically connected to the motherboard through a flexible circuit board, such as, for example, the flexible film CF of FIG. 1B.

The control module CM controls overall operation of the display device DD. The control module CM may be a microprocessor. For example, the control module CM may activate or deactivate the display module 200. Based on touch signals received from the display module 200 and/or the electronic module 500, the control module CM may control other modules such as the image input module IIM and the acoustic input module AIM.

The wireless communications module TM may use Bluetooth® or WiFi® communications to transceive wireless signals with other terminals. The wireless communications module TM may use an ordinary communications system to transceive speech signals. The wireless communications module TM may include a transmitter TM1 that modulates and transmits signals to be transferred, and may also include a receiver TM2 that demodulates received signals.

The image input module IIM processes and converts image signals into image data for display on the display module 200. In a record mode or a speech recognition mode, the acoustic input module AIM receives external sound signals through a microphone, and converts the received sound signals into electrical voice data.

The external interface IF may serve as an interface connected to an external charger, a wire/wireless data port, and/or a card socket (e.g., memory card, SIM/UIM card).

The second electronic module EM2 may include an acoustic output module AOM, a light-emitting module LM, a light receiving module LRM, and a camera module CMM. These components may be directly mounted on the motherboard, may be mounted on a separate board and electrically connected through connectors to the display module 200, or may be electrically connected to the first electronic module EM1.

The acoustic output module AOM converts and outputs sound data that is received from the wireless communications module TM or is stored in the memory MM.

The light-emitting module LM generates and outputs light. The light-emitting module LM may output an infrared ray. The light-emitting module LM may include a light-emitting diode (LED) element. The light receiving module LRM may include a sensing element and detect an infrared ray, for example. The light receiving module LRM may be activated when detecting an infrared ray of a certain amplitude level or higher. The light receiving module LRM may include a complementary metal oxide semiconductor (CMOS) sensor. After the output of the infrared ray generated from the light-emitting module LM, the infrared ray may be reflected from an external substance (e.g., user's finger or face), and then the reflected infrared ray may be incident on the light receiving module LRM. The camera module CMM may capture an external image.

The electronic module 500 according to an exemplary embodiment of the present inventive concept may include at least one selected from components of the first electronic module EM1 and the second electronic module EM2. For example, the electronic module 500 may include one or more of the acoustic output modules AOM, the light-emitting module LM, the light receiving module LRM, the camera module CMM, and/or a heat sensing module. The electronic module 500 may detect an external object received through the sensing region SSA or may externally provide through the sensing region SSA acoustic signals such as voices or electromagnetic signals such as an infrared ray.

Figure 3A:
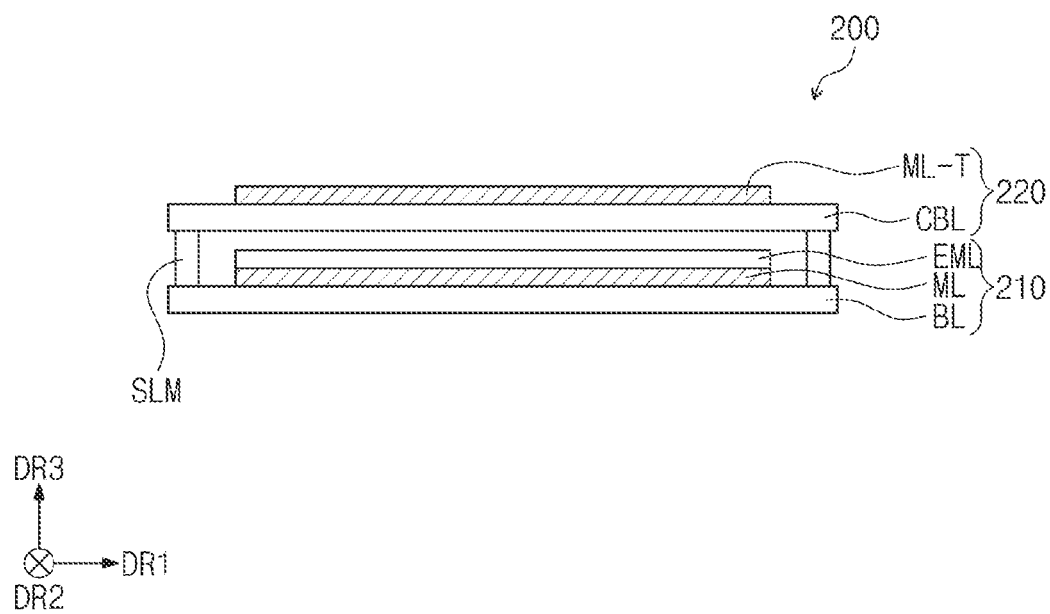
FIG. 3A is a cross-sectional diagram showing a display module according to an exemplary embodiment of the present inventive concept.
Figure 3B:
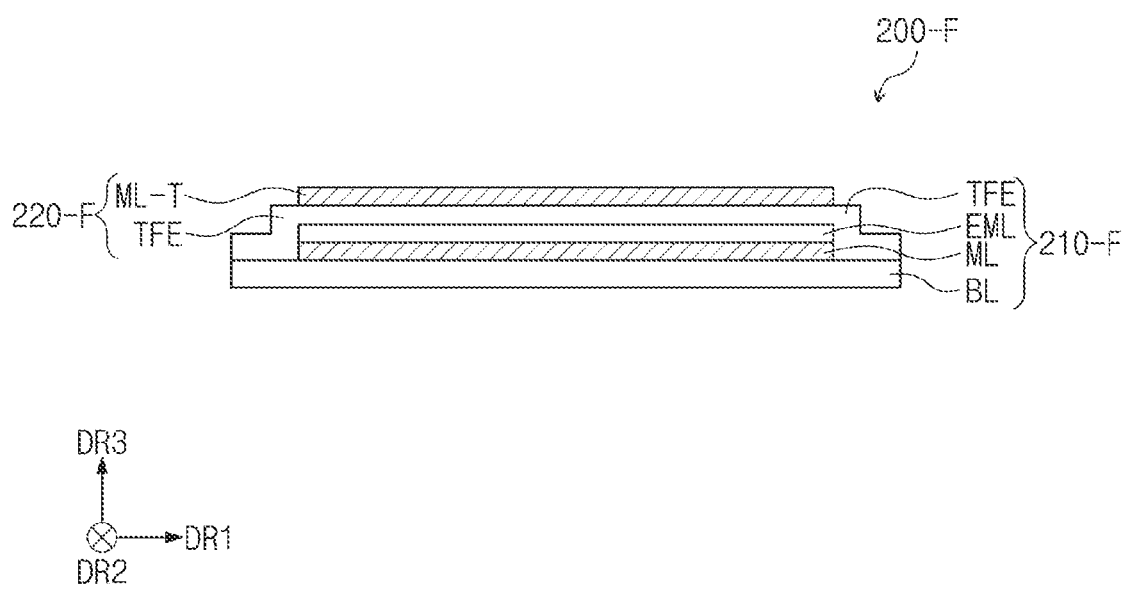
FIG. 3B is a cross-sectional diagram showing a display module according to an exemplary embodiment of the present inventive concept.

FIG. 3A illustrates a cross-sectional view showing a display module according to an exemplary embodiment of the present inventive concept. FIG. 3B illustrates a cross-sectional view showing a display module according to an exemplary embodiment of the present inventive concept. The same or similar reference symbols may be allocated to components identical or analogous to those shown in FIGS. 1A to 2. Repetitive description may be omitted.

Referring to FIG. 3A, the display module 200 may include a display panel 210, an input sensing part 220, and a coupling member SLM. The input sensing part 220 may be called an input sensing panel. It shall be understood that the direction DR3 is not limited to the same sign as the direction DR3 of FIGS. 1A and 1B. For example, the direction DR3 may be inverted in an alternate embodiment.

The display panel 210 according to an exemplary embodiment of the present inventive concept may be, but is not limited to, an emissive display panel. For example, the display panel 210 may be an organic light-emitting display panel or a quantum-dot light-emitting display panel.

The display panel 210 may include a base layer BL, a circuit element layer ML, and an emission layer EML. The input sensing part 220 may include a cover substrate CBL and a sensing circuit layer ML-T.

Each of the base layer BL and the cover substrate CBL may be a silicon substrate, a plastic substrate, a glass substrate, a dielectric film, or a stack structure including a plurality of dielectric layers.

The circuit element layer ML may be disposed on the base layer BL. The circuit element layer ML may include a plurality of dielectric layers, a plurality of conductive layers, and a semiconductor layer. The plurality of conductive layers included in the circuit element layer ML may constitute signal lines and/or a pixel control circuit.

The emission layer EML may be disposed on the circuit element layer ML. The emission layer EML may include an emission layer that generates light. For example, an organic light-emitting display panel may have an emission layer including an organic light-emitting material. Similarly, a quantum-dot light-emitting display panel may have an emission layer including one or more of a quantum dot and/or a quantum rod.

The cover substrate CBL may be disposed on the emission layer EML. A space may be defined between the cover substrate CBL and the emission layer EML. The space may be filled with air or an inert gas. Alternatively, in another exemplary embodiment of the present inventive concept, the space may be filled with a filler such as a silicone-based polymer, an epoxy-based resin, and/or an acryl-based resin.

The sensing circuit layer ML-T may be disposed on the cover substrate CBL. The sensing circuit layer ML-T may include a plurality of dielectric layers and a plurality of conductive layers. The plurality of conductive layers may constitute a sensing electrode that detects external inputs, a sensing line connected to the sensing electrode, and a sensing pad connected to the sensing line.

The coupling member SLM may be disposed between the base layer BL and the cover substrate CBL. The coupling member SLM may couple the base layer BL and the cover substrate CBL to each other. The coupling member SLM may include an organic material such as a photo-curable resin or q photo-plastic resin, or an inorganic material such as a frit seal, but the present inventive concept is not limited thereto.

Referring to FIG. 3B, a display module 200-F may include a display panel 210-F and an input sensing part 220-F according to an exemplary embodiment of the present inventive concept. The input sensing part 220-F may be called an input sensing layer.

The display panel 210-F may include a base layer BL, a circuit element layer ML, an emission layer EML, and a thin-film encapsulation layer TFE. The input sensing part 220-F may include a base layer TFE and a sensing circuit layer ML-T. The thin-film encapsulation layer TFE of the display panel 210-F and the base layer TFE of the input sensing part 220-F may be the same component.

According to an exemplary embodiment of the present inventive concept, the display panel 210-F and the input sensing part 220-F may be formed in a successive process. For example, the sensing circuit layer ML-T may be directly formed on the thin-film encapsulation layer (or the base layer) TFE.

Figure 4A:
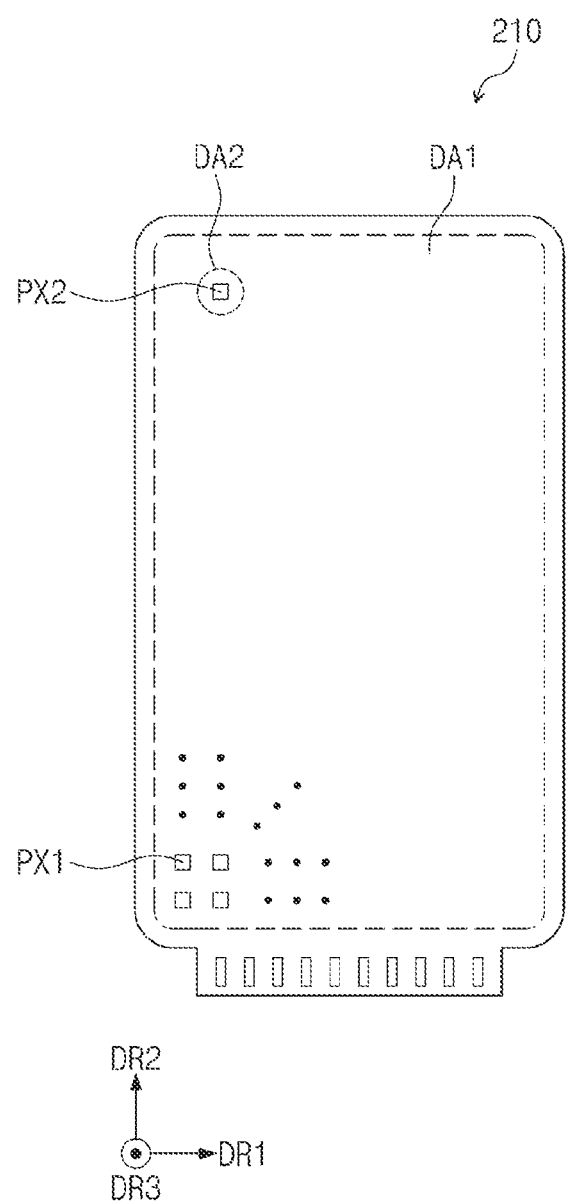
FIG. 4A is a plan view diagram showing a display panel according to an exemplary embodiment of the present inventive concept.
Figure 4B:
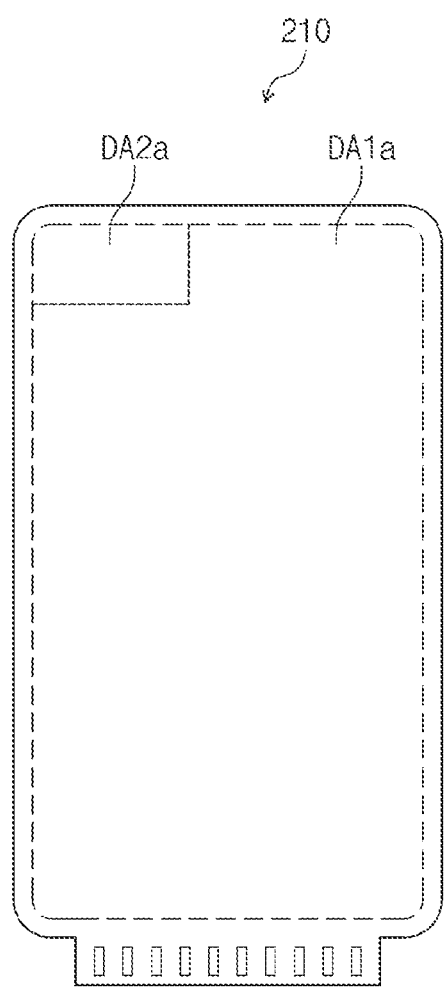
FIG. 4B is a plan view diagram showing a display panel according to an exemplary embodiment of the present inventive concept.
Figure 4C:
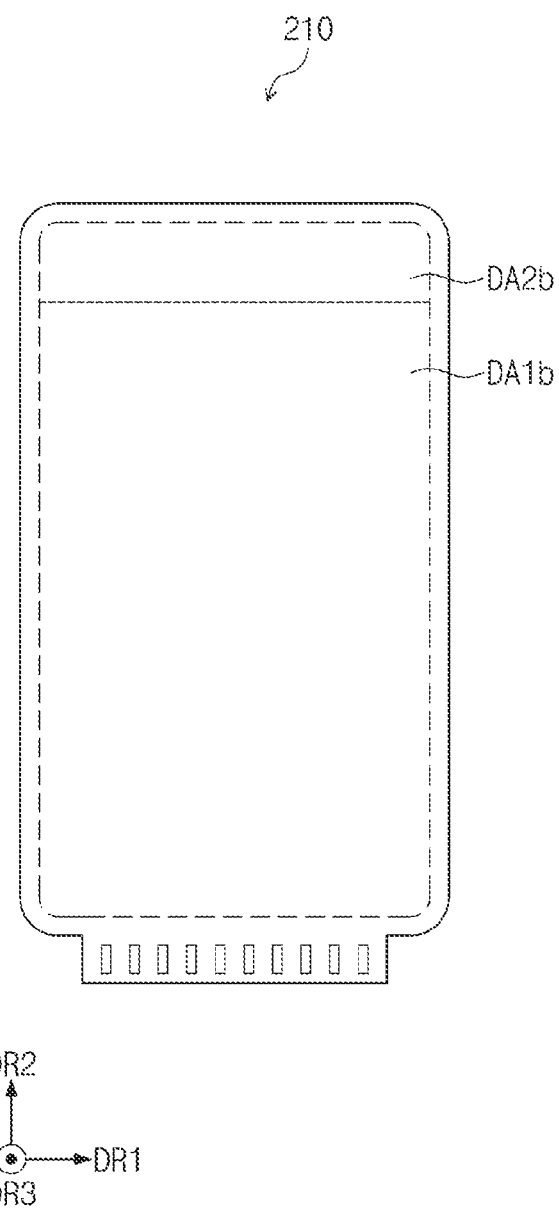
FIG. 4C is a plan view diagram showing a display panel according to an exemplary embodiment of the present inventive concept.

FIG. 4A illustrates a plan view showing a display panel according to an exemplary embodiment of the present inventive concept. FIG. 4B illustrates a plan view showing a display panel according to an exemplary embodiment of the present inventive concept. FIG. 4C illustrates a plan view showing a display panel according to an exemplary embodiment of the present inventive concept. The same or similar reference symbols may be allocated to components identical or analogous to those shown in FIGS. 1A to 3B. Repetitive description may be omitted.

Referring to FIG. 4A, the display panel 210 may include a first display region DA1 and a second display region DA2 according to an exemplary embodiment of the present inventive concept. The first display region DA1 and the second display region DA2 may overlap the active region (see AA of FIG. 1B) of the display module (see 200 of FIG. 1B).

The electronic module (see 500 of FIG. 1B) may be disposed below the display panel 210 and may underlie the second display region DA2. The second display region DA2 may have transmittance greater than that of the first display region DA1. Therefore, the electronic module 500 may easily transmit and/or receive signals through the second display region DA2. One or more components of the second display region DA2 may be omitted to increase transmittance of the second display region DA2. For example, one or more pixels may be absent from the second display region DA2.

In an exemplary embodiment of the present inventive concept, the second display region DA2 may be provided on a location that corresponds to that of the sensing region (see SSA of FIG. 1A). For example, when two sensing regions SSA are provided, two second display regions DA2 may be provided. The second display regions DA2 may be spaced apart from each other. Each of the second display regions DA2 may be surrounded with the first display region DA1.

The first display region DA1 may include first pixels PX1, and the second display region DA2 may include second pixels PX2. The first pixels PX1 and the second pixels PX2 may each be a pixel to generate light. The number of the first pixels PX1 on a certain zone may be different from that of the second pixels PX2 on another zone whose area is the same as that of the certain zone. For example, the number of the second pixels PX2 may be less than that of the first pixels PX1. Therefore, the second display region DA2 may have transmittance greater than that of the first display region DA1. In addition, the second display region DA2 may have resolution less than that of the first display region DA1.

Referring to FIG. 4B, the display panel 210 may include a first display region DA1$a$ and a second display region DA2$a$ according to an exemplary embodiment of the present inventive concept.

The electronic module (see 500 of FIG. 1B) may be disposed below the display panel 210 and may underlie the second display region DA2$a$. When viewed on a plane, the second display region DA2$a$ may underlie the sensing region (see SSA of FIG. 1A). In an exemplary embodiment, the second display region DA2$a$ may have an area greater than that of the sensing region SSA.

FIG. 4B depicts by way of example that the second display region DA2$a$ is defined on a left corner, but a position of the second display region DA2$a$ may be changed depending on a position of the electronic module 500. For example, in an exemplary embodiment of the present inventive concept, the second display region DA2$a$ may be defined on a right corner of the display panel 210. For another example, the second display region DA2$a$ may be defined on both of left and right corners of the display panel 210.

Referring to FIG. 4C, in an exemplary embodiment, the display panel 210 may include a first display region DA1$b$ and a second display region DA2$b$.

The electronic module (see 500 of FIG. 1B) may be disposed below the display panel 210 and may underlie the second display region DA2$b$.

The electronic module (see 500 of FIG. 1B) may be placed below the second display region DA2$b$. When viewed on a plane, the second display region DA2$b$ may underlie the sensing region (see SSA of FIG. 1A). In an exemplary embodiment, the second display region DA2$b$ may have an area greater than that of the sensing region SSA.

The first display region DA1$b$ and the second display region DA2$b$ may be arranged in the second direction DR2. The first display region DA1$b$ and the second display region DA2$b$ may have therebetween a boundary that extends in the first direction DR1. In an exemplary embodiment, the second display region DA2$b$ may have a bar shape.

When viewed on a plane, the second display region DA2$b$ may be defined on an upper portion of the display panel 210. As the second display region DA2$b$ may have an area greater than that of the second display region DA2 discussed above in FIG. 4A and that of the second display region DA2$a$ discussed above in FIG. 4B, the electronic module 500 may increase in relation to the degrees of freedom for positional change.

Figure 5:
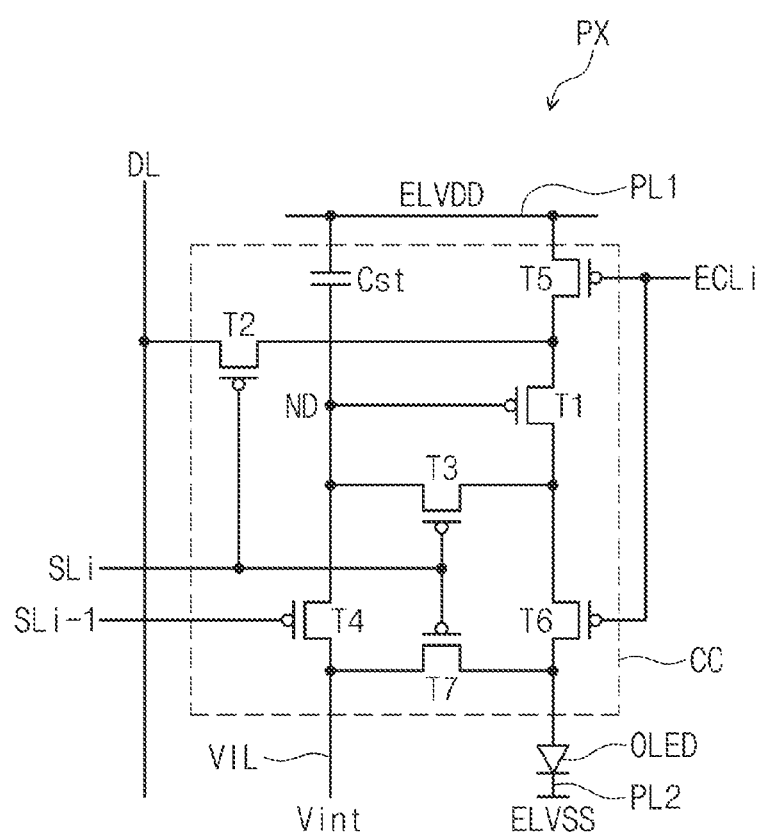
FIG. 5 is an equivalent circuit diagram showing a pixel according to an exemplary embodiment of the present inventive concept.
Figure 6:
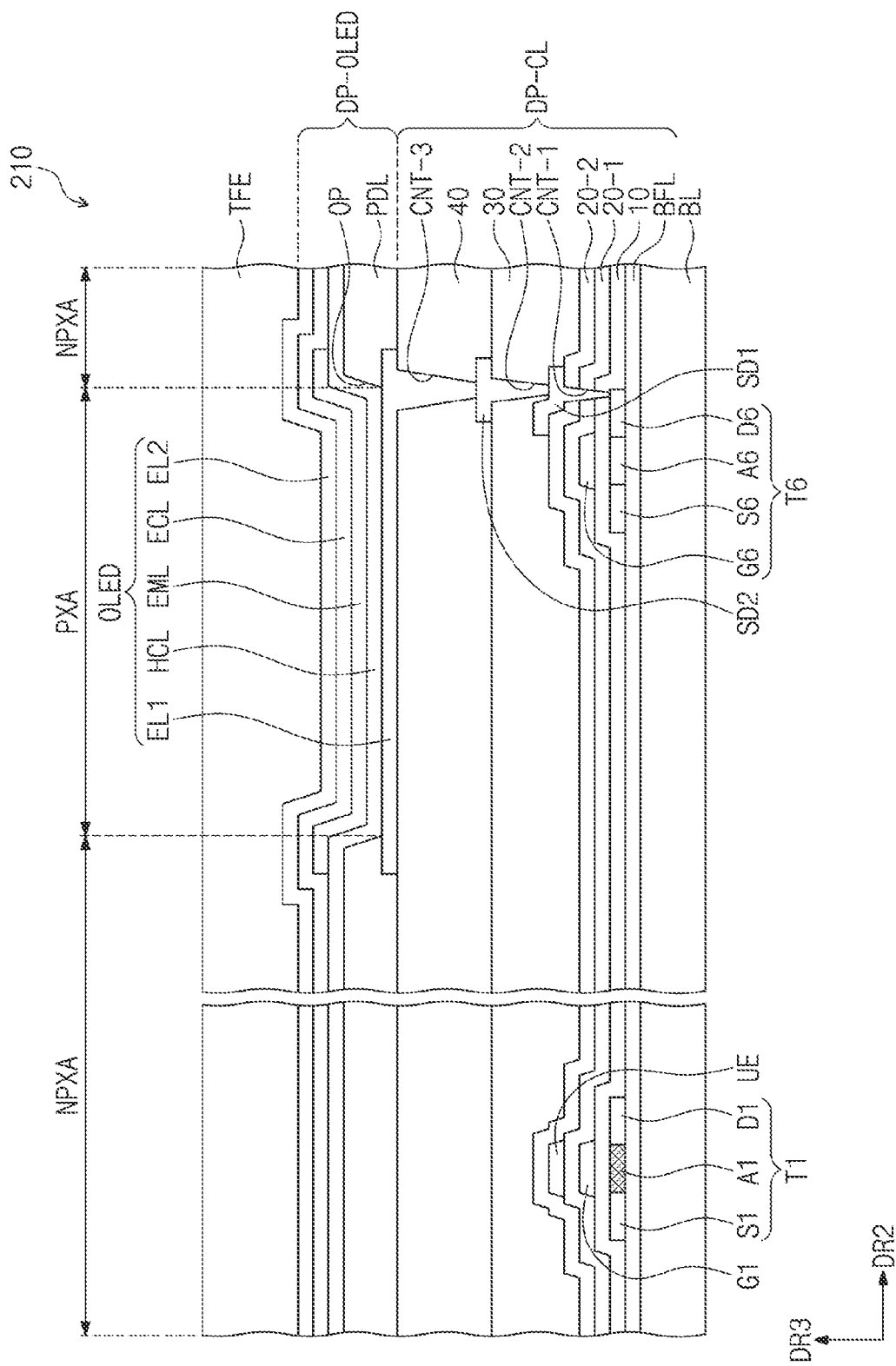
FIG. 6 is a cross-sectional diagram showing some components of a display panel according to an exemplary embodiment of the present inventive concept.

FIG. 5 illustrates an equivalent circuit for a pixel according to an exemplary embodiment of the present inventive concept. FIG. 6 illustrates a cross-sectional view showing some components of a display panel according to an exemplary embodiment of the present inventive concept. The same or similar reference symbols may be allocated to components identical or analogous to those shown in FIGS. 1A to 4C, and repetitive description may be omitted.

Referring to FIG. 5, a pixel PX According to an exemplary embodiment of the present inventive concept may be provided in the active region (see AA of FIG. 1B) and may provide light. The following description of the pixel PX may be identically applicable to pixels disposed on the first display regions DA1, DA1a, and DA1b shown in FIGS. 4A to 4C and on the second display regions DA2, DA2a, and DA2b shown in FIGS. 4A to 4C, without limitation thereto.

The pixel PX may be electrically connected to a plurality of signal lines. FIG. 5 depicts by way of example scan lines SLi and SLi−1, a data line DL, a first power line PL1, a second power line PL2, an initialization power line VIL, and an emission control line ECLi. These, however, are merely examples, and the pixel PX according to an exemplary embodiment of the present inventive concept may be additionally connected to various signal lines, or may not have one or more of the signal lines mentioned above.

The pixel PX may include a light-emitting element OLED and a pixel circuit CC. The pixel circuit CC may include a capacitor Cst and a plurality of transistors, such as, for example, first to seventh transistors T1 to T7. In response to a data signal on the data line DL, the pixel circuit CC may control an amount of current flowing through the light-emitting element OLED.

The light-emitting element OLED may emit light at a certain brightness level in response to an amount of current provided from the pixel circuit CC. For this, a first power voltage ELVDD on the first power line PL1 may be set to a higher level than that of a second power voltage ELVSS on the second power line PL2.

Each of the first to seventh transistors T1 to T7 may include an input electrode (or source electrode), an output electrode (or drain electrode), and a control electrode (or gate electrode). For convenience of description, one of the input and output electrodes may be called a first electrode in this specification, and the other of the input and output electrodes may be called a second electrode in this specification.

The first electrode of the first transistor T1 may be connected through the fifth transistor T5 to the first power line PL1. The first power line PL1 may be supplied with the first power voltage ELVDD. The second electrode of the first transistor T1 is coupled through the sixth transistor T6 to an anode electrode of the light-emitting element OLED. In this description, the first transistor T1 may be called a drive transistor.

In response to voltage applied to the control electrode of the first transistor T1, the first transistor T1 may control an amount of current flowing through the light-emitting element OLED.

The second transistor T2 is coupled between the data line DL and the first electrode of the first transistor T1. The control electrode of the second transistor T2 is coupled to an $i^{th}$ scan line SLi. When the $i^{th}$ scan line SLi is provided with an $i^{th}$ scan signal, the second transistor T2 is turned on to electrically couple the data line DL to the first electrode of the first transistor T1.

The third transistor T3 is coupled between the second electrode of the first transistor T1 and the control electrode of the first transistor T1. The control electrode of the third transistor T3 is coupled to the $i^{th}$ scan line SLi. When the $i^{th}$ scan line SLi is provided with the $i^{th}$ scan signal, the third transistor T3 is turned on to electrically couple the second electrode of the first transistor T1 to the control electrode of the first transistor T1. Accordingly, when the third transistor T3 is turned on, the first transistor T1 is coupled in a diode type of mode.

The fourth transistor T4 is coupled between a node ND at the control electrode of the first transistor T1 and the initialization power line VIL. The control electrode of the fourth transistor T4 is coupled to an $(i-1)^{th}$ scan line SLi−1. The node ND may be a node to which are coupled the fourth transistor T4 and the control electrode of the first transistor T1. When the $(i-1)^{th}$ scan line SLi−1 is provided with an $(i-1)^{th}$ scan signal, the fourth transistor T4 is turned on to provide the node ND with an initialization voltage Vint from the initialization power line VIL.

The fifth transistor T5 is coupled between the first power line PL1 and the first electrode of the first transistor T1. The sixth transistor T6 may be coupled between the second electrode of the first transistor T1 and the anode electrode of the light-emitting element OLED. An $i^{th}$ emission control line ECLi is coupled to the control electrode of the fifth transistor T5 and to the control electrode of the sixth transistor T6.

The seventh transistor T7 is coupled between the initialization power line VIL and the anode electrode of the light-emitting element OLED. The control electrode of the seventh transistor T7 is coupled to the $i^{th}$ scan line SLi. When the $i^{th}$ scan line SLi is provided with the $i^{th}$ scan signal, the seventh transistor T7 is turned on to provide the initialization voltage Vint to the anode electrode of the light-emitting element OLED.

The seventh transistor T7 may increase the capability of the pixel PX in representing black. For example, when the seventh transistor T7 is turned on, a parasitic capacitance of the light-emitting element OLED is discharged. Then, when back brightness is implemented, a leakage current from the first transistor T1 need not allow the light-emitting element OLED to emit light, and the pixel PX may have increased capability in representing black.

In addition, FIG. 5 shows that the control electrode of the seventh transistor T7 is coupled to the $i^{th}$ scan line SLi, but the present inventive concept is not limited thereto. In an alternate embodiment of the present inventive concept, the control electrode of the seventh transistor T7 may be coupled to either the $(i-1)^{th}$ scan line SLi−1 or an $(i+1)^{th}$ scan line.

FIG. 5 depicts an example including PMOS transistors, but the present inventive concept is not limited thereto. In an alternate embodiment of the present inventive concept, the pixel circuit CC may be configured to include NMOS transistors. In an alternate embodiment of the present inventive concept, the pixel circuit CC may be configured to include a combination of NMOS and PMOS transistors.

The capacitor Cst is disposed between the first power line PL1 and the node ND. The capacitor Cst stores voltage corresponding to a data signal. When the fifth and sixth transistors T5 and T6 are turned on, an amount of current flowing through the first transistor T1 may be controlled by the voltage stored in the capacitor Cst.

The light-emitting element OLED may be electrically connected to the sixth transistor T6 and the second power line PL2. The light-emitting element OLED may receive the second power voltage ELVSS through the second power line PL2. The light-emitting element OLED may include an emission layer.

The light-emitting element OLED may emit light due to voltage that corresponds to a difference between a signal transferred through the sixth transistor T6 and the second power voltage ELVSS received through the second power line PL2.

According to an exemplary embodiment of the present inventive concept, a structure of the pixel PX is not limited to that shown in FIG. 5. In an alternate embodiment of the present inventive concept, the pixel PX may be implemented in various configurations suitable for the light-emitting element OLED to emit light. For example, current devices may be used instead of, or in addition to, voltage devices.

Referring to FIG. 6, the display panel 210 may include a plurality of dielectric layers, a semiconductor pattern, a conductive pattern, and a signal line. A coating or deposition process may form a dielectric layer, a semiconductor layer, and a conductive layer. Afterwards, a photolithography process may selectively pattern the dielectric layer, the semiconductor layer, and the conductive layer. The processes mentioned above may form the semiconductor pattern, the conductive pattern, and the signal line that are included in a circuit element layer DP-CL and a display element layer DP-OLED.

The circuit element layer DP-CL includes a base layer BL that may include a synthetic resin film. The base layer BL may have a multi-layered structure. For example, the base layer BL may have a tri-layered structure including a synthetic resin layer, an adhesive layer, and a synthetic layer. The synthetic resin layer may include a thermosetting resin. For example, the synthetic resin layer may be a polyimide-based resin layer, but the material of the synthetic resin layer is not particularly limited. The synthetic resin layer may include at least one selected from acryl-based resin, methacryl-based resin, polyisoprene, vinyl-based resin, epoxy-based resin, urethane-based resin, cellulose-based resin, siloxane-based resin, polyamide-based resin, and perylene-based resin. The base layer BL may include one or more of a glass substrate, a metal substrate, and an organic/inorganic composite substrate.

At least one inorganic layer may be disposed on a top surface of the base layer BL. The inorganic layer may include at least one selected from aluminum oxide, titanium oxide, silicon oxide, silicon oxynitride, zirconium oxide, and hafnium oxide. The inorganic layer may be formed as multi-layered. The multi-layered inorganic layers may constitute a barrier layer and/or a buffer layer.

In an exemplary embodiment, the display panel 210 is illustrated to include such a buffer layer BFL. The buffer layer BFL increases a bonding force between the base layer BL and the semiconductor pattern. The buffer layer BFL may include a silicon oxide layer and a silicon nitride layer. The silicon oxide layer and the silicon nitride layer may be alternately stacked.

The semiconductor pattern is disposed on the buffer layer BFL. The semiconductor pattern may include polysilicon. The present inventive concept, however, is not limited thereto, and the semiconductor pattern may include, for example, amorphous silicon or metal oxide.

FIG. 6 shows a portion of the semiconductor pattern, and when viewed on a plane, the semiconductor pattern may further be disposed on another portion of the pixel PX1 and/or PX2 of FIG. 4A or PX of FIG. 5, for example. The semiconductor pattern may be specifically arranged over the pixels PX. The semiconductor pattern may have an electrical property that is determined based on whether or not the semiconductor pattern is doped. The semiconductor pattern may include a doped region and an undoped region. The doped region may be implanted with n-type or p-type impurities. A p-type transistor includes a doped region implanted with p-type impurities.

The doped region has conductivity greater than that of the undoped region, and substantially serves as an electrode or a signal line. The undoped region substantially corresponds to an active or channel of a transistor. For example, a portion of the semiconductor pattern may be an active of a transistor, another portion of the semiconductor pattern may be a source or drain of the transistor, and still another portion of the semiconductor pattern may be a connection electrode or a connection signal line.

As shown in FIG. 6, the first transistor T1 may include a source S1, an active A1, and a drain D1, all of which are formed from the semiconductor pattern, and likewise the sixth transistor T6 may include a source S6, an active A6, and a drain D6, all of which are formed from the semiconductor pattern. When viewed in cross-section, the source S1 and the drain D1 may extend in opposite directions from the active A1, and the source S6 and the drain D6 may extend in opposite directions from the active A6. FIG. 6 partially shows a connection signal line formed from contact holes to the semiconductor pattern.

A first middle dielectric layer 10 is disposed on the buffer layer BFL. The first middle dielectric layer 10 commonly overlaps a plurality of pixels PX and covers the semiconductor pattern. The first middle dielectric layer 10 may be an inorganic layer and/or an organic layer, and may have a single-layered or multi-layered structure. The first middle dielectric layer 10 may include at least one selected from aluminum oxide, titanium oxide, silicon oxide, silicon oxynitride, zirconium oxide, and hafnium oxide. In an exemplary embodiment, the first middle dielectric layer 10 may be a single-layered silicon oxide layer. The first middle dielectric layer 10, a dielectric layer of the circuit element layer DP-CL, may be an inorganic layer and/or an organic layer, and the organic layer of the circuit element layer DP-CL may have a single-layered or multi-layered structure. The inorganic layer may include at least one selected from the materials mentioned above.

Gates G1 and G6 are disposed on the first middle dielectric layer 10. The gates G1 and G6 may be portions of a metal pattern. The gates G1 and G6 may overlap the actives A1 and A6, respectively. The gates G1 and G6 may serve as a mask used in a process where the semiconductor pattern is doped.

The first middle dielectric layer 10 is provided thereon with a second middle dielectric layer 20-1 that covers the gates G1 and G6. The second middle dielectric layer 20-1 may commonly overlap the pixels PX. The second middle dielectric layer 20-1 may be an inorganic layer and/or an organic layer, and may have a single-layered or multi-layered structure. In an exemplary embodiment, the second middle dielectric layer 20-1 may be a single-layered silicon oxide layer.

An upper electrode UE is disposed on the second middle dielectric layer 20-1 over the first transistor T1. When viewed on a plane, the upper electrode UE may overlap the gate G1 of the first transistor T1. The upper electrode UE may receive electrical signals the same as or different from those of the gate G1, thereby serving as a capacitor electrode.

The second middle dielectric layer 20-1 is provided thereon with an additional dielectric layer 20-2 that covers the upper electrode UE. The additional dielectric layer 20-2 may commonly overlap the pixels PX. The additional dielectric layer 20-2 may be an inorganic layer and/or an organic layer, and may have a single-layered or multi-layered structure. In an exemplary embodiment, the additional dielectric layer 20-2 may be a single-layered silicon oxide layer. In an alternate embodiment, the upper electrode UE and/or the additional dielectric layer 20-2 may be omitted, as the present inventive concept is not limited to a particular embodiment.

A first connection electrode SD1 may be disposed on the additional dielectric layer 20-2. The first connection electrode SD1 may be coupled to a connection signal line through a contact hole CNT-1 that penetrates the first middle dielectric layer 10, the second middle dielectric layer 20-1, and the additional dielectric layer 20-2.

A first dielectric layer 30 is disposed on the additional dielectric layer 20-2. The first dielectric layer 30 may be an organic layer. A second connection electrode SD2 may be disposed on the first dielectric layer 30. The second connection electrode SD2 may be coupled to the first connection electrode SD1 through a contact hole CNT-2 that penetrates the first dielectric layer 30.

The first dielectric layer 30 is provided thereon with a second dielectric layer 40 that covers the second connection electrode SD2. The second dielectric layer 40 may be an organic layer. A first electrode EL1 is disposed on the second dielectric layer 40. The first electrode EL1 is connected to the second connection electrode SD2 through a contact hole CNT-3 that penetrates the second dielectric layer 40. An opening OP is defined in a pixel definition layer PDL. The opening OP of the pixel definition layer PDL exposes at least a portion of the first electrode EL1.

As shown in FIG. 6, the active region (see AA of FIG. 1B) of the display panel 210 may include an emission region PXA and a non-emission region NPXA adjacent to the emission region PXA. The non-emission region NPXA may surround the emission region PXA. In an exemplary embodiment, the first electrode EL1 has a portion exposed to the opening OP, and the emission region PXA is defined to correspond to the exposed portion of the first electrode EL1.

A hole control layer HCL may be disposed in common on the emission region PXA and the non-emission region NPXA. The hole control layer HCL may include a hole transport layer and further include a hole injection layer. An emission layer EML is disposed on the hole control layer HCL. The emission layer EML may be disposed in a zone that corresponds to the opening OP. For example, the emission layer EML may be formed on each of the pixels PX.

An electron control layer ECL is disposed on the emission layer EML. The electron control layer ECL may include an electron transport layer and further include an electron injection layer. An open mask may be used such that the hole control layer HCL and the electron control layer ECL are formed in common on a plurality of pixels PX. A second electrode EL2 is disposed on the electron control layer ECL. The second electrode EL2 has a unitary shape and is disposed in common on a plurality of pixels PX.

A thin-film encapsulation layer TFE is disposed on the second electrode EL2. The thin-film encapsulation layer TFE is disposed in common on a plurality of pixels PX. For example, the thin-film encapsulation layer TFE may directly cover the second electrode EL2. In an alternate embodiment of the present inventive concept, the thin-film encapsulation layer TFE and the second electrode EL2 may further be provided therebetween with a capping layer that covers the second electrode EL2. In this configuration, the thin-film encapsulation layer TFE may directly cover the capping layer.

The thin-film encapsulation layer TFE is disposed on and encapsulates the light-emitting element OLED. Although not shown, the second electrode EL2 and the light-emitting element OLED may further be provided therebetween with a capping layer that covers the second electrode EL2.

The thin-film encapsulation layer TFE may include a first inorganic layer, an organic layer, and/or a second inorganic layer that are sequentially stacked along the third direction DR3, without limitation thereto. The present inventive concept, however, is not limited thereto, and the thin-film encapsulation layer TFE may further include a plurality of inorganic layers and a plurality of organic layers, for example.

The first inorganic layer may cover the second electrode EL2. The first inorganic layer may prevent the light-emitting element OLED from being attacked by external moisture or oxygen. For example, the first inorganic layer may include silicon nitride, silicon oxide, or any combination thereof. The first inorganic layer may be formed by chemical vapor deposition.

The organic layer may be disposed on and in contact with the first inorganic layer. The organic layer may provide the first inorganic layer with a planarized surface. The organic layer may cover uneven portions formed on or particles present on a top surface of the first inorganic layer, and thus a state of the top surface of the first inorganic layer need not affect components formed on the organic layer. In addition, the organic layer may relieve stress between layers in contact with each other. The organic layer may include an organic material, and may be formed by a solution process such as spin coating, slit coating, or inkjet coating.

The second inorganic layer is disposed on and covers the organic layer. The second inorganic layer may be formed more stably on a flat surface than on the first inorganic layer. The second inorganic layer may encapsulate moisture released from the organic layer and prevent the moisture from being discharged to the outside. The second inorganic layer may include silicon nitride, silicon oxide, or any combination thereof. The second inorganic layer may be formed by chemical vapor deposition.

In an exemplary embodiment of the present inventive concept, a display layer DP includes a circuit element layer DP-CL having first light-emitting elements OLED of a first emitter type (e.g., red light) and second light-emitting elements of a second emitter type (e.g., green light); a sensing circuit layer ML-T overlapping the circuit element layer and having non-light-emitting elements of a sensor type (e.g., infrared light); and a pixel definition layer PDL overlapping the circuit element layer and the sensing circuit layer, and having first openings defining first light-emitting pixels on the first light-emitting elements of the first emitter type, second openings defining second light-emitting pixels on the second light-emitting elements of the second emitter type, and sensor openings defining non-light-emitting pixels on the non-light-emitting elements.

Figure 7:
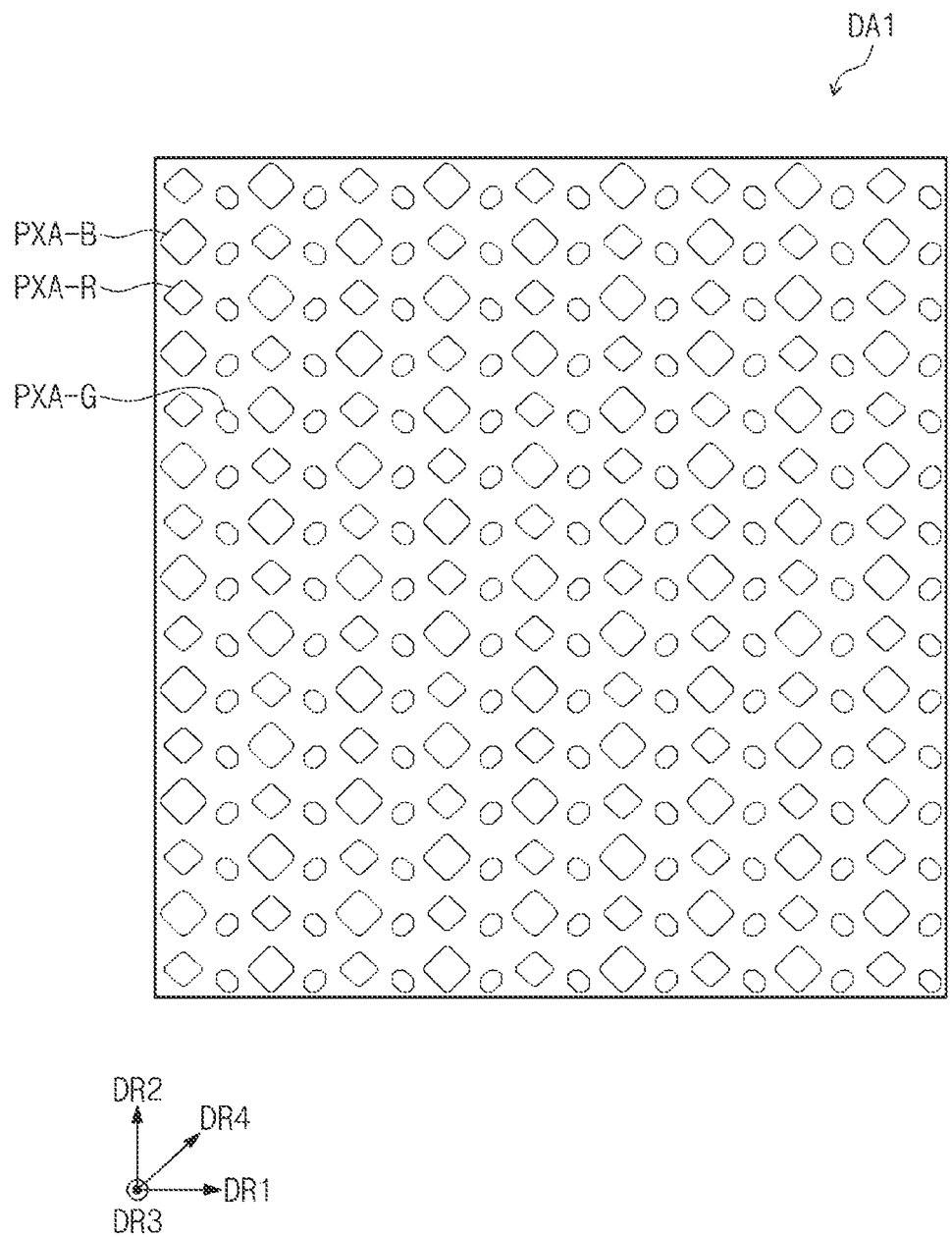
FIG. 7 is a plan view diagram showing an arrangement of pixels according to an exemplary embodiment of the present inventive concept.
Figure 8:
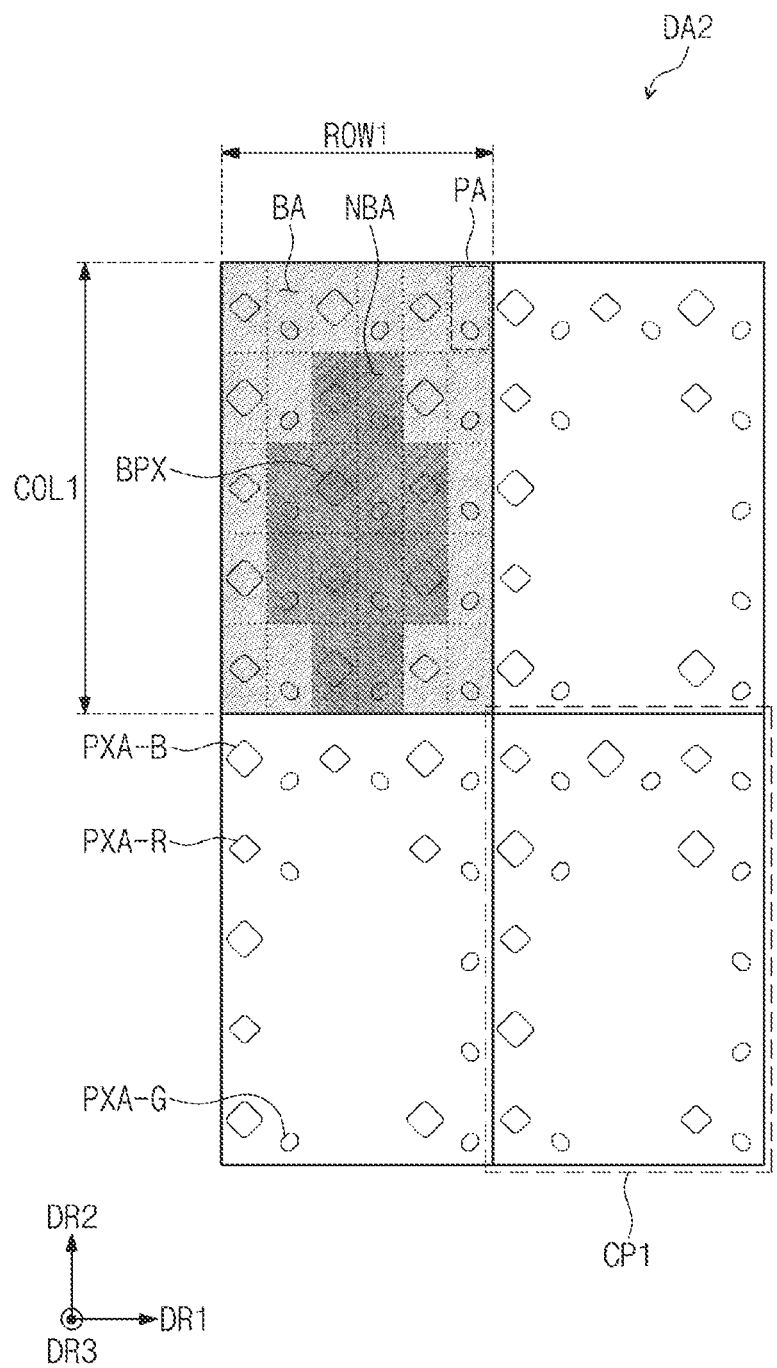
FIG. 8 is a plan view diagram showing an arrangement of pixels according to an exemplary embodiment of the present inventive concept.
Figure 9A:
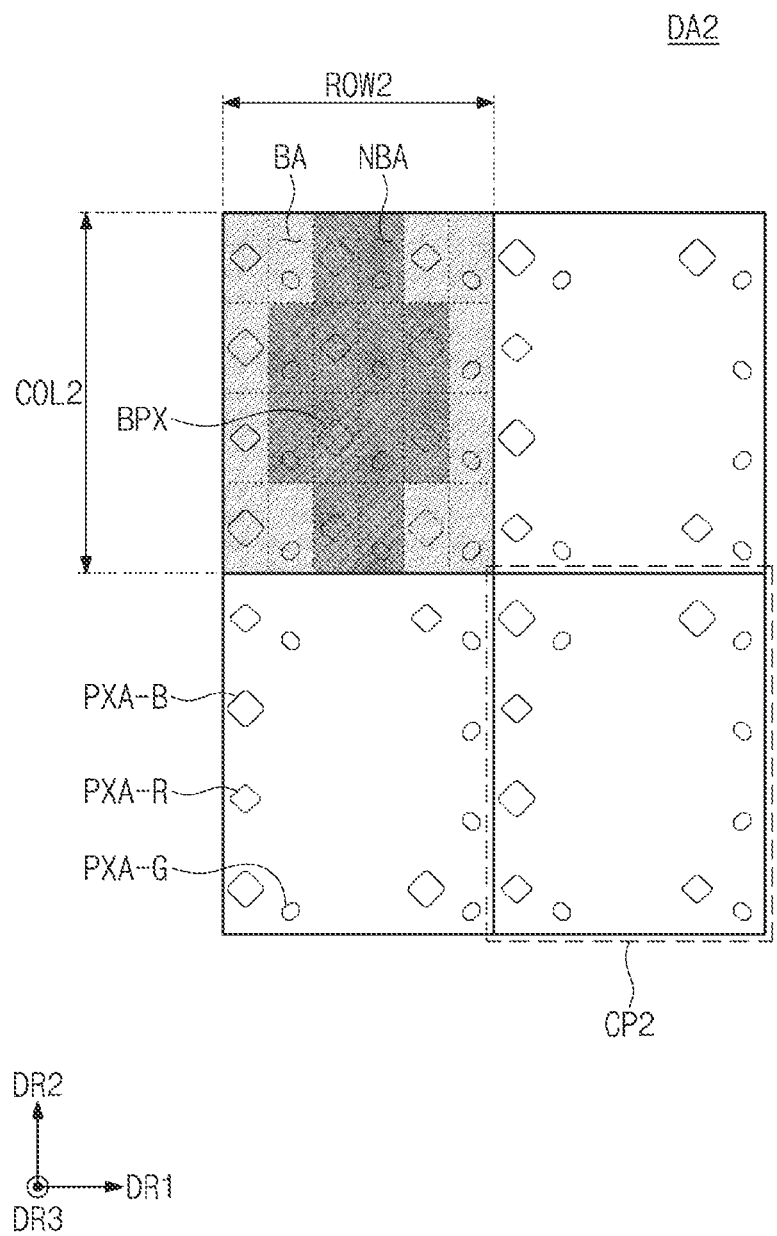
FIGS. 9A and 9B are plan view diagrams showing an arrangement of pixels according to an exemplary embodiment of the present inventive concept.
Figure 9B:
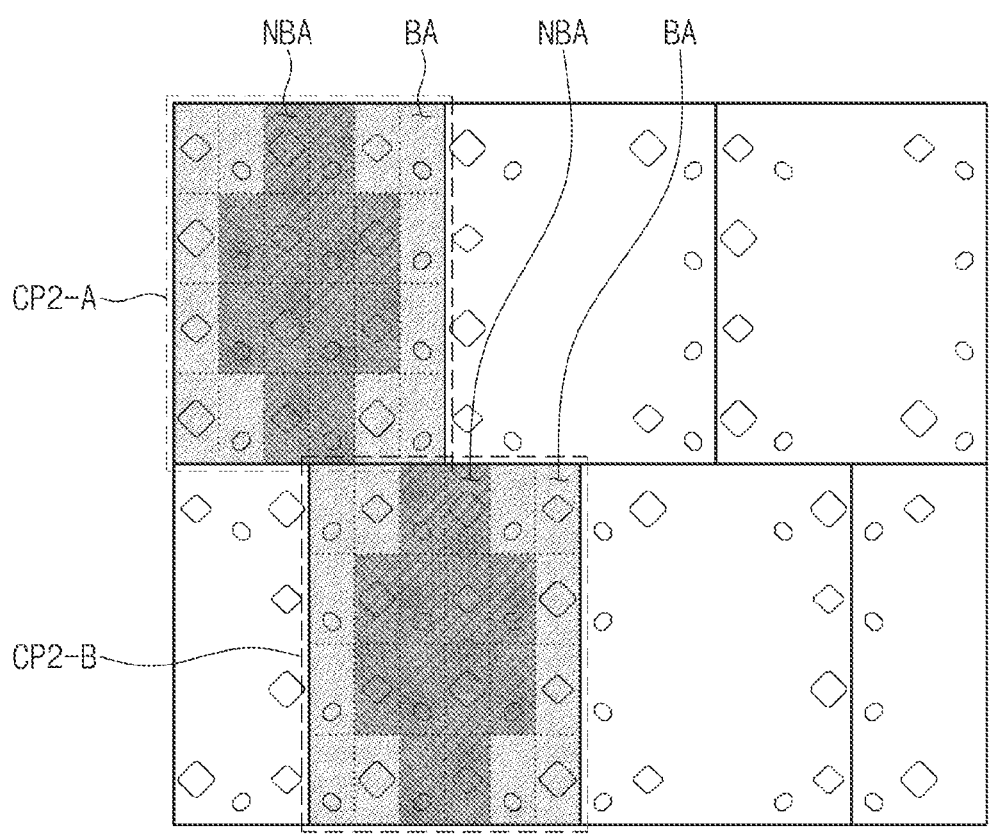
Figure 10:
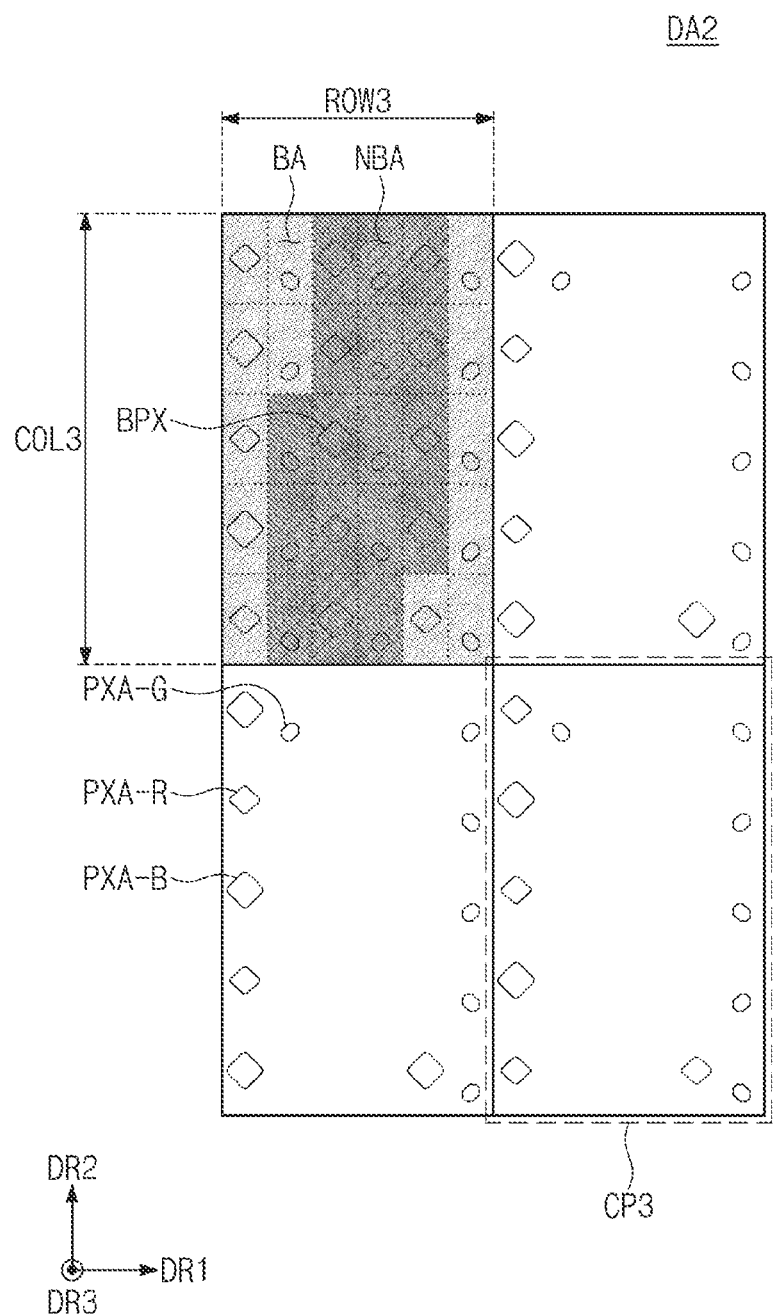
FIG. 10 is a plan view diagram showing an arrangement of pixels according to an exemplary embodiment of the present inventive concept.

FIG. 7 illustrates a plan view showing an arrangement of pixels according to an exemplary embodiment of the present inventive concept. FIG. 8 illustrates a plan view showing an arrangement of pixels according to an exemplary embodiment of the present inventive concept. FIGS. 9A and 9B illustrate plan views showing an arrangement of pixels according to an exemplary embodiment of the present inventive concept. FIG. 10 illustrates a plan view showing an arrangement of pixels according to an exemplary embodiment of the present inventive concept.

Referring to FIG. 7, the first display region DA1 according to an exemplary embodiment may include a plurality of light-emitting pixels PXA-B (e.g., blue), PXA-G (e.g., green), and PXA-R (e.g., red) that are arranged along the first direction DR1, the second direction DR2, and a fourth direction DR4. In an exemplary embodiment, each of the plurality of light-emitting pixels PXA-B, PXA-G, and PXA-R may correspond to the pixel PX discussed in FIGS. 5 and 6.

According to an exemplary embodiment, a first light-emitting pixel PXA-B and a second light-emitting pixel PXA-R may be alternately disposed spaced apart from each other along the first direction DR1. In addition, the first light-emitting pixel PXA-B and the second light-emitting pixel PXA-R may be alternately disposed along the second direction DR2.

A third light-emitting pixel PXA-G may be disposed along the fourth direction DR1 between the first light-emitting pixel PXA-B and the second light-emitting pixel PXA-R. Moreover, each third light-emitting pixel PXA-G may be disposed along the fourth direction DR4 between first light-emitting pixels PXA-B or between second light-emitting pixels PXA-R. The diamond-like arrangement shown in FIG. 7 may be called a Pentile® structure.

In an exemplary embodiment, the emission regions (see, e.g., PXA of FIG. 6) of the light-emitting pixels PXA-B, PXA-G, and PXA-R may have different areas from each other. In the present inventive concept, an area of light generated from each of the light-emitting pixels PXA-B, PXA-G, and PXA-R may correspond to that of the emission region PXA, or that of the first electrode EL1 exposed to the opening OP of the pixel definition layer PDL discussed in FIG. 6.

In an exemplary embodiment of the present inventive concept, each of the light-emitting pixels PXA-B, PXA-G, and PXA-R may be substantially defined as a single light-emitting unit PA that includes the light-emitting element OLED and the pixel circuit CC discussed in FIG. 5, but for convenience of description in FIGS. 8 to 10 below, the light-emitting pixels PXA-B, PXA-G, and PXA-R will each be simply illustrated as an iconic shape of the emission region PXA of each of the light-emitting pixels PXA-B, PXA-G, and PXA-R, where the actual shape may be induced from the opening OP of the pixel definition layer PDL.

The light-emitting pixels PXA-B, PXA-G, and PXA-R may generate light different from each other. For example, the light-emitting pixels PXA-B, PXA-G, and PXA-R may respectively produce a blue light, a green light, and a red light, without limitation thereto.

The following description of the first display region DA1 shown in FIG. 7 may be identically or similarly applicable to each of the first display regions DA1, DA1a, and DA1b discussed in FIGS. 4A to 4C. In the present inventive concept, the light-emitting pixels PXA-B, PXA-G, and PXA-R disposed on the first display regions DA1 may be defined to refer to first pixels, such as of FIGS. 4A to 4C.

The following description of the second display region DA2 shown in FIGS. 8 to 10 below may be identically or similarly applicable to each of the second display region DA2, DA2, and DA2a discussed in FIGS. 4A to 4C. In the present inventive concept, the light-emitting pixels PXA-B, PXA-G, and PXA-R and non-light-emitting pixels BPX disposed on the second display region DA2 may be defined to refer to second pixels, such as of FIGS. 4A to 4C.

FIGS. 8 to 10 depict the non-light-emitting pixels BPX each of which need not include one or more components of the light-emitting pixels PXA-B, PXA-G, and PXA-R. For example, the non-light-emitting pixel BPX need not include either the first electrode EL1 discussed in FIG. 6 or one or more of the components included in the pixel circuit CC of each of the light-emitting pixels PXA-B, PXA-G, and PXA-R. The present inventive concept, however, is not limited thereto, and at least one selected from the second electrode EL2 and/or the emission layer EML discussed in FIG. 6 may be omitted from the non-light-emitting pixels BPX.

For descriptive purposes in the second display region DA2 shown in FIGS. 8 to 10 below, only one transmission cell is virtually illustrated to include the non-light-emitting pixels BPX that are disposed depending on the arrangement of the light-emitting pixels PXA-B, PXA-G, and PXA-R. In addition, the transmission cell is illustrated such that sections on which the non-light-emitting pixels BPX are disposed are shown darker than those on which the light-emitting pixels PXA-B, PXA-G, and PXA-R are disposed.

Referring to FIG. 8, the second display region DA2 according to an exemplary embodiment may be defined as a zone where the second pixels are disposed. The second pixels may include light-emitting pixels PXA-B, PXA-G, and PXA-R and non-light-emitting pixels BPX.

In an exemplary embodiment, the light-emitting pixels PXA-B, PXA-G, and PXA-R may be components that correspond to the light-emitting pixels PXA-B, PXA-G, and PXA-R discussed in FIG. 7. Therefore, the light-emitting pixels PXA-B, PXA-G, and PXA-R disposed in the second display region DA2 may produce colors that correspond to those generated from the light-emitting pixels PXA-B, PXA-G, and PXA-R disposed on the first display region DA1, and may be driven by the same signals as those applied to the light-emitting pixels PXA-B, PXA-G, and PXA-R disposed on the first display region DA1. Alternately, the light-emitting pixels PXA-B, PXA-G, and PXA-R disposed in the second display region DA2 may be driven by other signals based on those applied to the light-emitting pixels PXA-B, PXA-G, and PXA-R disposed on the first display region DA1, but blended for color or intensity, and/or adjusted for amplitude or duration.

In an exemplary embodiment, a transmission cell CP1 may be defined based on the number of the second pixels that are arranged along the first direction DR1 and the second direction DR2. The transmission cell CP1 may be defined by multiplication of the number of pixels in a row ROW1 and the number of pixels in a column COL1. For example, in the transmission cell CP1 according to an exemplary embodiment, the number of pixels in the row ROW1 may be about six, and the number of pixels in the column COL1 may be about five. Accordingly, about thirty second pixels may be disposed on a single transmission cell CP1.

In an exemplary embodiment, in a single transmission cell CP1, the number of the light-emitting pixels PXA-B, PXA-G, and PXA-R may be greater than the number of the non-light-emitting pixels BPX. A fraction of about ⅔ may be given to a ratio of the non-light-emitting pixels BPX to the total number of second pixels in the transmission cell CP1. For example, on the transmission cell CP1, a value of about 30 may be given to a sum total of the number of the non-light-emitting pixels BPX and the number of the light-emitting pixels PXA-B, PXA-G, and PXA-R, and a value of about 12 may be given to the number of the non-light-emitting pixels BPX. In such cases, the transmission cell CP1 may include the non-light-emitting pixels BPX having a percentage of about 40% of the total by number.

In an exemplary embodiment, a plurality of transmission cells CP1 may be disposed on the second display region DA2. The plurality of transmission cells CP1 may be arranged along the first direction DR1 and the second direction DR2.

According to an exemplary embodiment of the present inventive concept, the transmission cell CP1 may be divided into a first section BA in which one of the light-emitting pixels PXA-B, PXA-G, and PXA-R is disposed for each pixel zone as indicated by dotted lines, and a second section NBA in which one of the non-light-emitting pixels BPX is disposed for each pixel zone as indicated by dotted lines. For convenience of description, the first section BA and the second section NBA are illustrated with different shading for each section and dotted lines for each pixel zone in only one transmission cell CP1. The dotted lines may distinguish zones correspondingly disposed on the pixel circuits CC of the light-emitting pixels PXA-B, PXA-G, and PXA-R.

For example, in an exemplary embodiment, the first section BA may be a zone where there is disposed the pixel circuit CC included in one of the light-emitting pixels PXA-B, PXA-G, and PXA-R. The first section BA of the third light-emitting pixel PXA-G may have the same area as that of the first section BA of the first light-emitting pixel PXA-B. The first section BA of the third light-emitting pixel PXA-G and its adjacent first section BA of the first light-emitting pixel PXA-B may collectively have a square shape.

In addition, the first section BA of the third light-emitting pixel PXA-G may have the same area as that of the first section BA of the second light-emitting pixel PXA-R. The first section BA of the third light-emitting pixel PXA-G and its adjacent first section BA of the second light-emitting pixel PXA-R may collectively have a square shape.

According to an exemplary embodiment of the present inventive concept, the pixel circuits CC of the light-emitting pixels PXA-B, PXA-G, and PXA-R may have the same area, and the emission regions (see PXA of FIG. 6) of the light-emitting pixels PXA-B, PXA-G, and PXA-R may have different areas based on an area of the first electrode EL1 exposed to the opening OP of the pixel definition layer PDL discussed in FIG. 6. According to an exemplary embodiment of the present inventive concept, the second pixels may be disposed in the transmission cells CP1 included in the second display region DA2 overlapping the electronic module (see 500 of FIG. 1B). According to an exemplary embodiment of the present inventive concept, a total area of the first sections BA included in a single transmission cell CP1 may be different from a total area of the second sections NBA in the same transmission cell CP1. For example, an area ratio between the first sections BA and the second sections NBA may be about 18:12 or 3:2 in the transmission cell CP1.

According to an exemplary embodiment of the present inventive concept, the transmission cell CP1 may be configured such that the first sections BA surround at least portions of the second sections NBA, and that the first sections BA and the second sections NBA have different numbers of pixels from each other along the first direction DR1 and the second direction DR2, which may be defined as a honeycomb configuration.

According to an exemplary embodiment of the present inventive concept, as the light-emitting pixels PXA-B, PXA-G, and PXA-R included in the second display region DA2 have the honeycomb configuration, the occurrence of color coordinate shift may be prevented at the second display region DA2 overlapping the electronic module (see 500 of FIG. 1B). Therefore, even when the electronic module (see 500 of FIG. 1B) is disposed below the display panel (see 210 of FIGS. 1B and 2), it may be possible to increase sensitivity of the electronic module 500 and to decrease diffraction of light generated from the light-emitting pixels PXA-B, PXA-G, and PXA-R. As a result, a display device may be provided to have increased visibility.

Referring to FIG. 9A, a transmission cell CP2 according to an exemplary embodiment may be defined based on the number of the second pixels that are arranged along the first direction DR1 and the second direction DR2. The transmission cell CP2 may be defined by multiplication of the number of pixels in a row ROW2 and the number of pixels in a column COL2. For example, on the transmission cell CP2 according to an exemplary embodiment, the number of pixels in the row ROW2 may be about six, and the number of pixels in the column COL1 may be about four. Accordingly, about 24 second pixels may be disposed on a single transmission cell CP2.

In an exemplary embodiment, on a single transmission cell CP2, the number of the light-emitting pixels PXA-B, PXA-G, and PXA-R may be the same as the number of the non-light-emitting pixels BPX. On a single transmission cell CP2, the number of the non-light-emitting pixels BPX may be about half the number of the second pixels. For example, on the transmission cell CP2, a value of about 24 may be given to a sum total of the number of the non-light-emitting pixels BPX and the number of the light-emitting pixels PXA-B, PXA-G, and PXA-R, and a value of about 12 may be given to the number of the non-light-emitting pixels BPX. In such cases, the transmission cell CP2 may include the non-light-emitting pixels BPX having a percentage of about 50% of the total by number.

In an exemplary embodiment, a plurality of transmission cells CP2 may be disposed on the second display region DA2. The plurality of transmission cells CP2 may be arranged along the first direction DR1 and the second direction DR2.

According to an exemplary embodiment of the present inventive concept, the second pixels may be disposed on the transmission cells CP2 included in the second display region DA2 overlapping the electronic module (see 500 of FIG. 1B). According to an exemplary embodiment of the present inventive concept, a total area of the first sections BA included in a single transmission cell CP2 may be the same as a total area of the second sections NBA in the same transmission cell CP2.

According to an exemplary embodiment of the present inventive concept, the transmission cell CP2 may be configured such that the first sections BA surround at least portions of the second sections NBA, and that the first sections BA and the second sections NBA have different numbers of pixels from each other along the first direction DR1 and the second direction DR2, which may be defined as a honeycomb configuration.

Referring to FIG. 9B, in an exemplary embodiment, a first transmission cell CP2-A and a second transmission cell CP2-B may each be disposed to extend along the first direction DR1, and the first and second transmission cells CP2-A and CP2-B may be disposed adjacent to each other in the second direction DR2. Each of the first and second transmission cells CP2-A and CP2-B may include the second pixels that are arranged similarly or identically to the second pixels of the transmission cell CP2 discussed in FIG. 9A.

Each of the first and second transmission cells CP2-A and CP2-B includes the first section BA and the second section NBA.

In an exemplary embodiment, the second transmission cell CP2-B may be shifted in the first direction DR1 from the first transmission cell CP2-A by a distance corresponding to sizes of three sections BA and/or NBA. Therefore, in comparison with the arrangement of the transmission cells CP2 of FIG. 9A, the arrangement of the transmission cells CP2-A and CP2-B may reduce diffraction of light incident on the transmission cells CP2-A and CP2-B and of light generated from the light-emitting pixels PXA-B, PXA-G, and PXA-R. As a result, a display device may be provided to have high visibility.

Referring to FIG. 10, a transmission cell CP3 according to an exemplary embodiment may be defined based on the number of the second pixels that are arranged along the first direction DR1 and the second direction DR2. The size of the transmission cell CP3 may be defined by multiplication of the number of pixels in a row ROW3 and the number of pixels in a column COL3. For example, the number of pixels in the row ROW3 may be about six, and the number of pixels in the column COL3 may be about five. Accordingly, about 30 second pixels may be disposed on a single transmission cell CP3.

In an exemplary embodiment, on a single transmission cell CP3, the number of the light-emitting pixels PXA-B, PXA-G, and PXA-R may be less than the number of the non-light-emitting pixels BPX. A fraction of about 17/30 may be given to a ratio of the non-light-emitting pixels BPX to the second pixels in the transmission cell CP3. For example, on the transmission cell CP3, a value of about 30 may be given to a sum total of the number of the non-light-emitting pixels BPX and the number of the light-emitting pixels PXA-B, PXA-G, and PXA-R, and a value of about 17 may be given to the number of the non-light-emitting pixels BPX. In such cases, the transmission cell CP3 may include the non-light-emitting pixels BPX having a percentage of about 57% of the total by number. In an alternate embodiment, the PXA-G pixel in the second row and second column may be replaced with a BPX pixel, changing the ratio from 17/30 to 18/30, or 3/5 for 60%. In another alternate embodiment, the PXA-B pixel towards the lower right (row 5, column 4) may be replaced with a BPX pixel, changing the ratio from 17/30 to 18/30, or 3/5. In another alternate embodiment, the PXA-B pixel towards the lower left (row 5, column 1) may be replaced with a BPX pixel, changing the ratio from 17/30 to 18/30, or 3/5. In another alternate embodiment, the PXA-B pixel towards the middle left (row 3, column 1) may be replaced with a BPX pixel, changing the ratio from 17/30 to 18/30, or 3/5. In another alternate embodiment, the ratio may exceed 3/5 or 60%, such as, for example, by replacing all pixels in the second through fourth columns with BPX pixels for a ratio of 2/3 or about 67%.

In an exemplary embodiment of the present inventive concept, each non-light-emitting pixel BPX is bounded on at least two sides by other immediately adjacent non-light-emitting pixels, and bounded on no more than two sides by immediately adjacent light-emitting pixels such as PXA-R, PXA-G, and/or PXA-B, where a ratio of a quantity of the non-light-emitting pixels to a sum of the quantities of the non-light-emitting pixels plus the light-emitting pixels is between about ½ and about ⅗.

In an exemplary embodiment of the present inventive concept, the display layer DP may include an electronic module 500 including the non-light-emitting elements disposed under at least one of the non-light-emitting pixels BPX, wherein the sensor type is responsive to infrared light.

In an exemplary embodiment of the present inventive concept, the display layer may include a transmission cell CP including a heterogenous array of light-emitting pixels PXA disposed around a periphery of non-light-emitting pixels BPX arranged in a number of rows of a first direction DR1 and a different number of columns of a second direction DR2 intersecting the first direction, where each non-light-emitting pixel BPX is bounded on at least two sides by other immediately adjacent non-light-emitting pixels BPX, where a non-zero and non-unitary ratio of a quantity of non-light-emitting pixels BPX to all pixels BPX+PXA is different along each of the rows versus each of the columns, where a ratio of the quantity of non-light-emitting pixels BPX to total pixels BPX+PXA in the transmission cell CP is in a range from about ½ to about ⅗.

In an exemplary embodiment, a plurality of transmission cells CP3 may be disposed on the second display region DA2. The plurality of transmission cells CP3 may be arranged along the first direction DR1 and the second direction DR2.

According to an exemplary embodiment of the present inventive concept, the second pixels may be disposed on the transmission cells CP3 included in the second display region DA2 overlapping the electronic module (see 500 of FIG. 1B). According to an exemplary embodiment of the present inventive concept, a total area of the first sections BA included in a single transmission cell CP3 may be different from a total area of the second sections NBA in the same transmission cell CP3. For example, an area ratio between the first sections BA and the second sections NBA may be about 13:17 in the transmission cell CP3.

According to an exemplary embodiment of the present inventive concept, the transmission cell CP3 may be configured such that the first sections BA surround at least portions of the second sections NBA, and that the first sections BA have different numbers of pixels along the first direction DR1 and the second direction DR2, which may be defined as a honeycomb configuration.

As shown in FIGS. 6-10, a display layer DP may have third light-emitting elements OLED of a third emitter type, and the pixel definition layer PDL may have third openings defining third light-emitting pixels on the third light-emitting elements, where the first emitter type is configured to emit red light, the second emitter type is configured to emit green light, and the third emitter type is configured to emit blue light. Sizes of the first PXA-R, second PXA-G, and third PXA-B openings may be different from each other. The size of the first openings may be larger than the size of the second openings and smaller than the size of the third openings, where sizes of the fourth openings BPX may be greater than or equal to the sizes of at least one of the first, second, or third openings. A quantity of the first light-emitting pixels PXA-R may be substantially equal to a quantity of the third light-emitting pixels PXA-B, where a quantity of the second light-emitting pixels PXA-G may be substantially equal to a sum of the quantity of the first light-emitting pixels and the quantity of the third light-emitting pixels.

The display layer DP may include an electronic module 500 including the non-light-emitting elements disposed under a plurality of the non-light-emitting pixels BPX, where the sensor type comprises at least three sensor types responsive to at least red light, green light, and blue light, respectively. The first openings PXA-R may be oriented substantially the same as each other; the third openings PXA-B may be oriented substantially the same as each other. The second openings PXA-G may be oriented in a first direction where disposed on a diagonal of adjacent pixels comprising the first openings, and oriented in a second direction where disposed on a diagonal of adjacent pixels comprising the second openings. The second openings PXA-G may be elongated on one axis and oriented with the elongated axis disposed on a diagonal of adjacent first openings PXA-R.

FIGS. 11 to 16 illustrate plan views showing a light-emitting unit according to an exemplary embodiment of the present inventive concept. The same or similar reference symbols may be allocated to components identical or analogous to those shown in FIGS. 1A to 10, and repetitive description may be omitted.

The following description of light-emitting units shown in FIGS. 11 to 16 may be identically applicable to the light-emitting unit PA illustrated in FIG. 8, and this may also hold true for FIGS. 7 and 9A to 10.

In an exemplary embodiment of the present inventive concept, the light-emitting unit PA may be defined as a compartment defined by multiplication of the number of row pixels and the number of column pixels. Therefore, the number of pixels in one light-emitting unit explained below in FIGS. 11 to 16 may be calculated as the number of pixels in one light-emitting unit discussed in FIGS. 8 to 10. The following will describe light-emitting units according to an exemplary embodiment of the present inventive concept with reference to FIGS. 11 to 16.

Figure 11:
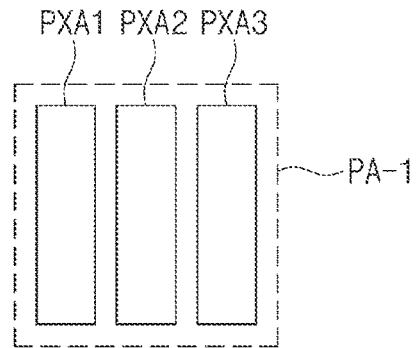
FIG. 11 is a plan view diagram showing a light-emitting unit according to an exemplary embodiment of the present inventive concept.

Referring to FIG. 11, a light-emitting unit PA-1 according to an exemplary embodiment may include a first sub-pixel PXA1, a second sub-pixel PXA2, and a third sub-pixel PXA3. The first to third sub-pixels PXA1, PXA2, and PXA3 may generate light different from each other.

The first to third sub-pixels PXA1, PXA2, and PXA3 may be linearly arranged along one direction. The first to third sub-pixels PXA1, PXA2, and PXA3 may have the same area, and may each have a tetragonal shape, such as, for example, a rectangular shape.

Figure 12:
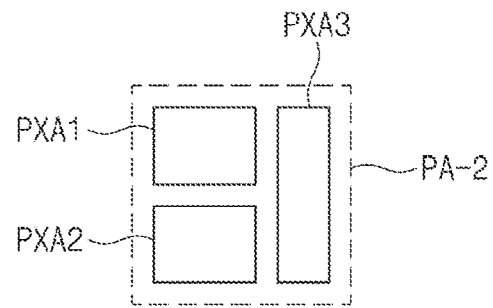
FIG. 12 is a plan view diagram showing a light-emitting unit according to an exemplary embodiment of the present inventive concept.

Referring to FIG. 12, a light-emitting unit PA-2 according to an exemplary embodiment may include a first sub-pixel PXA1, a second sub-pixel PXA2, and a third sub-pixel PXA3. The first to third sub-pixels PXA1, PXA2, and PXA3 may each have a rectangular shape. Each of the first and second sub-pixels PXA1 and PXA2 may extend in one direction or in a horizontal direction, and the third sub-pixel PXA3 may extend in another direction or in a vertical direction intersecting the one direction.

The first and second sub-pixels PXA1 and PXA2 may be arranged along the vertical direction, and the third sub-pixel PXA3 may be arranged along the horizontal direction with respect to the first and second sub-pixels PXA1 and PXA2. The third sub-pixel PXA3 may have an area different from those of the first and second sub-pixels PXA1 and PXA2.

The third sub-pixel PXA3 may have a long side that is disposed to face a short side of each of the first and second sub-pixels PXA1 and PXA2.

FIGS. 11 and 12 depict by way of example that each of the light-emitting units PA-1 and PA-2 includes three sub-pixels PXA1, PXA2, and PXA3, but the present inventive concept is not limited thereto. For example, one or both of the light-emitting units PA-1 and PA-2 may include two sub-pixels, or at least four sub-pixels.

Figure 13:
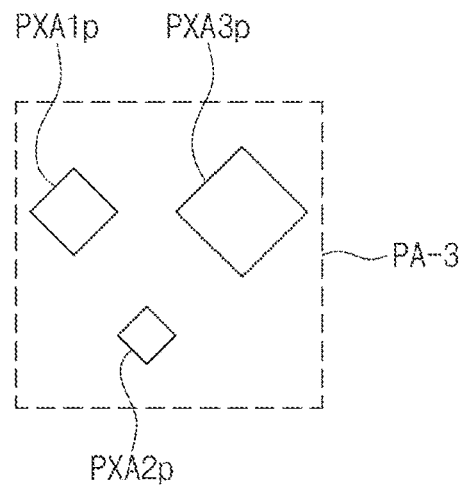
FIG. 13 is a plan view diagram showing a light-emitting unit according to an exemplary embodiment of the present inventive concept.

Referring to FIG. 13, a light-emitting unit PA-3 according to an exemplary embodiment may include a first sub-pixel PXA1p, a second sub-pixel PXA2p, and a third sub-pixel PXA3p.

The first to third sub-pixels PXA1p, PXA2p, and PXA3p may each have a rhombic shape. The first to third sub-pixels PXA1p, PXA2p, and PXA3p may have light-emitting areas different from each other. For example, the light-emitting area of the third sub-pixel PXA3p may be greater than the light-emitting area of the first sub-pixel PXA1p, which, in turn, may be greater than the light-emitting area of the second sub-pixel PXA2p, but embodiments are not limited thereto. For example, the relative areas of the sub-pixels may be adapted to the efficiency of color production from the device and/or the color sensitivity of the viewer.

The first sub-pixel PXA1p may have a first area, the second sub-pixel PXA2p may have a second area, and the third sub-pixel PXA3p may have a third area. The first area may be greater than the second area, and the third area may be greater than the first area. The diamond-like arrangement shown in FIG. 13 may be called a Pentile® structure.

According to an exemplary embodiment, areas of the pixel circuits CC of the first, second, and third sub-pixels PXA1p, PXA2p, and PXA3p may collectively have a square shape.

Figure 14:
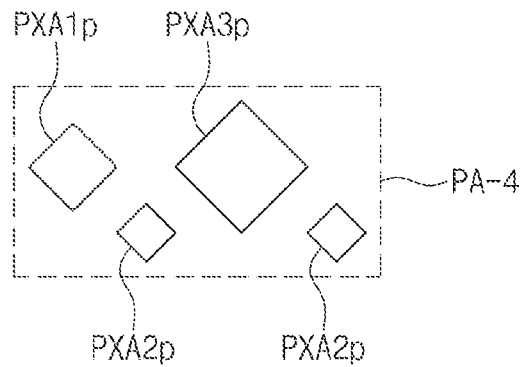
FIG. 14 is a plan view diagram showing a light-emitting unit according to an exemplary embodiment of the present inventive concept.
Figure 15:
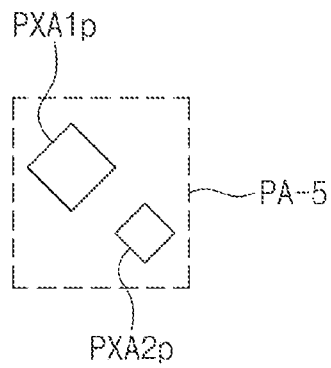
FIG. 15 is a plan view diagram showing a light-emitting unit according to an exemplary embodiment of the present inventive concept.
Figure 16:
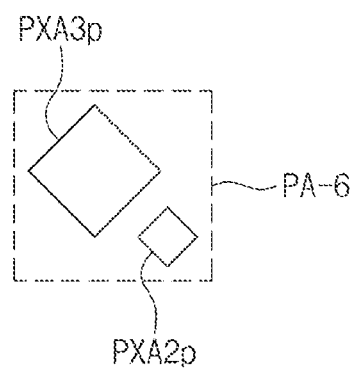
FIG. 16 is a plan view diagram showing a light-emitting unit according to an exemplary embodiment of the present inventive concept.

Referring to FIG. 14, in comparison with the light-emitting unit PA-3 of FIG. 13, a light-emitting unit PA-4 according to an exemplary embodiment may further include an additional second sub-pixel PXA2p. Referring to FIG. 15, in comparison with the light-emitting unit PA-3 of FIG. 13, a light-emitting unit PA-5 according to an exemplary embodiment need not include the third sub-pixel PXA3p. Referring to FIG. 16, in comparison with the light-emitting unit PA-3 of FIG. 13, a light-emitting unit PA-6 according to an exemplary embodiment need not include the first sub-pixel PXA1p.

According to an exemplary embodiment of the present inventive concept, an asymmetric shape may be provided in a zone where light-emitting pixels and the non-light-emitting pixels are disposed, and thus the occurrence of a color coordinate shift may be prevented at a region overlapping an electronic module. Therefore, even when the electronic module is disposed below a display panel, it may be possible to increase sensitivity of the electronic module and to decrease diffraction of light generated from the light-emitting pixels. As a result, a display device may be provided to have high visibility.

Although exemplary embodiments have been described with reference to a number of illustrative examples thereof, it will be understood by those of ordinary skill in the pertinent art that various changes in form and details may be made without departing from the spirit and scope of the present inventive concept as set forth in the following claims.

Thus, the technical scope of the present inventive concept is not limited by the exemplary embodiments and examples described above, but by the following claims and equivalents thereof.

What is claimed is:

1. A display panel, comprising:
   a first display region and a second display region adjacent to the first display region, the second display region divided into at least one transmission cell;
   a plurality of first pixels in the first display region, each of the plurality of first pixels including at least one transistor and a light-emitting element connected to the at least one transistor; and a plurality of second pixels in the second display region, the plurality of second pixels including a plurality of light-emitting pixels and a plurality of non-light-emitting pixels, the plurality of light-emitting pixels providing colors substantially the same as colors produced from the plurality of first pixels, the plurality of non-light-emitting pixels being defined by absence of at least one of the transistor or the light-emitting element, wherein the at least one transmission cell is defined by multiplication of a number of row pixels arranged in a first direction among the plurality of second pixels and a number of column pixels arranged in a second direction among the plurality of second pixels, the second direction intersecting the first direction, the at least one transmission cell including a contiguous group of the plurality of non-light-emitting pixels, wherein, in the transmission cell, the plurality of light-emitting pixels bounds the contiguous group of the plurality of non-light-emitting pixels and has different numbers of pixels along the first direction and the second direction, wherein, in the transmission cell, each of the contiguous group of the plurality of non-light-emitting pixels is bounded on at least two sides by adjacent others of the contiguous group of the plurality of non-light-emitting pixels and bounded on no more than two sides by adjacent ones of the plurality of light-emitting pixels, wherein, in the transmission cell, the contiguous group of the plurality of non-light-emitting pixels is disposed closer to the center of the transmission cell than the adjacent ones of the plurality of light-emitting pixels.

2. The display panel of claim 1, wherein, in the transmission cell, a ratio of the contiguous group of the plurality of non-light-emitting pixels to the plurality of second pixels is in a range between about ½ and about ⅗, wherein the transmission cell consists of the contiguous group of the plurality of non-light-emitting pixels and the adjacent ones of the plurality of light-emitting pixels.

3. The display panel of claim 1, wherein
the number of row pixels is about six, and
the number of column pixels is in a range from about four to about six.

4. The display panel of claim 1, wherein the transmission cell is provided in a plurality of transmission cells,
wherein the plurality of transmission cells are arranged along the first direction and the second direction.

5. The display panel of claim 4, wherein the plurality of transmission cells include a first transmission cell and a second transmission cell that are arranged along the second direction,
wherein the second transmission cell is spaced apart in the first direction from the first transmission cell at a distance corresponding to sizes of some of the plurality of light-emitting pixels.

6. The display panel of claim 1, wherein each of the plurality of light-emitting pixels is defined as a light-emitting unit,
wherein each light-emitting unit includes first, second, and third sub-pixels having light-emitting areas different from each other.

7. The display panel of claim 6, wherein the first, second, and third sub-pixels are disposed in a diamond shape.

8. The display panel of claim 1, wherein each of the plurality of light-emitting pixels is defined as a light-emitting unit, wherein each light-emitting unit includes first and second sub-pixels having light-emitting areas different from each other.

9. The display panel of claim 1, wherein, in the transmission cell, the contiguous group of the plurality of non-light-emitting pixels has different numbers along the first direction and the second direction.

10. The display panel of claim 1, wherein the first display region and the second display region are disposed on a base layer, and at least a portion of the second display region is surrounded by the first display region.

11. A display device, comprising:
a display panel that is divided into a first display region and a second display region adjacent to the first display region, the second display region divided into a plurality of transmission cells continuously arranged along a first direction and a second direction intersecting each other; and
an electronic module below the display panel and underlying the second display region,
wherein the first display region is populated by a plurality of first pixels consisting of a plurality of first light-emitting pixels, each including at least one transistor and a light-emitting element connected to the transistor,
wherein the second display region is populated by a plurality of second pixels consisting of a plurality of second light-emitting pixels, each of which provides a color substantially the same as a color produced from one of the plurality of first light-emitting pixels, and a plurality of non-light-emitting pixels, each of which is defined by absence of at least one of the transistor or the light-emitting element,
wherein each of the plurality of transmission cells is defined by multiplication of a first number of row pixels arranged in the first direction among the plurality of second pixels and a second number of column pixels arranged in the second direction among the plurality of second pixels,
wherein, in each of the plurality of transmission cells, the plurality of light-emitting pixels bounds a contiguous group of the plurality of non-light-emitting pixels,
wherein, each of the plurality of transmission cells, every radial path from a center of the respective transmission cell intersects all respective non-light-emitting pixels before all respective light-emitting pixels.

12. The display device of claim 11,
wherein, in each of the plurality of transmission cells, the plurality of light-emitting pixels has different numbers of pixels along the first direction and the second direction,
wherein, in each of the plurality of transmission cells, a ratio of a quantity of the non-light-emitting pixels to a sum of the quantities of the non-light-emitting pixels plus the light-emitting pixels is between about 1/2 and about 3/5.

13. The display device of claim 11, wherein
the number of row pixels is about six, and
the number of column pixels is in a range from about four to about six.

14. The display device of claim 11,
wherein the plurality of transmission cells are arranged along the first direction and the second direction,
wherein, in each of the plurality of transmission cells, the contiguous group of the plurality of non-light-emitting pixels is disposed closer to the center of the respective transmission cell than the plurality of light-emitting pixels adjacent to the non-light-emitting pixels.

15. The display device of claim 14,
wherein the plurality of transmission cells include a first transmission cell and a second transmission cell that are arranged along the second direction,
wherein the second transmission cell is spaced apart in the first direction from the first transmission cell at a distance corresponding to sizes of some of the plurality of light-emitting pixels.

16. The display device of claim 11,
wherein each of the plurality of light-emitting pixels is defined as a light-emitting unit,
wherein each light-emitting unit includes first, second, and third sub-pixels having light-emitting areas different from each other.

17. The display device of claim 16, wherein the first, second, and third sub-pixels are disposed in a diamond shape.

18. The display device of claim 11, wherein, in each of the plurality of transmission cells, the contiguous group of the plurality of non-light-emitting pixels has different numbers along the first direction and the second direction.

19. The display device of claim 11, wherein at least a portion of the second display region is surrounded by the first display region.

20. The display device of claim 11, wherein the electronic module includes at least one selected from an acoustic output module, a light-emitting module, a light receiving module, and a camera module.

21. The display device of claim 11,
wherein each of the at least one transmission cell into which the second region is divided has a substantially same or mirror image configuration of light-emitting pixels and non-light-emitting pixels.

22. A display layer comprising:
a circuit element layer having first light-emitting elements of a first emitter type and second light-emitting elements of a second emitter type;
a sensing circuit layer overlapping the circuit element layer and having non-light-emitting elements of a sensor type; and
a pixel definition layer overlapping the circuit element layer and the sensing circuit layer, and having first openings defining first light-emitting pixels on the first light-emitting elements of the first emitter type, second openings defining second light-emitting pixels on the second light-emitting elements of the second emitter type, and sensor openings defining non-light-emitting pixels on the non-light-emitting elements,
wherein each non-light-emitting pixel is bounded on no more than two sides by immediately adjacent light-emitting pixels,
wherein the bounded non-light-emitting pixels are disposed closer to the center of a transmission cell than the immediately adjacent light-emitting pixels,
wherein each non-light-emitting pixel is bounded on at least two sides by other immediately adjacent non-light-emitting pixels,
wherein a ratio of a quantity of the non-light-emitting pixels to a sum of the quantities of the non-light-emitting pixels plus the light-emitting pixels is between about ½ and about ⅗.

23. The display layer of claim 22, further comprising an electronic module including the non-light-emitting elements disposed under at least one of the non-light-emitting pixels, wherein the sensor type is responsive to infrared light.

24. The display layer of claim 22,
wherein the transmission cell includes a heterogenous array of light-emitting pixels disposed around a periphery of non-light-emitting pixels arranged in a number of rows of a first direction and a different number of columns of a second direction intersecting the first direction,
wherein each non-light-emitting pixel is bounded on at least two sides by other immediately adjacent non-light-emitting pixels,
wherein a non-zero and non-unitary ratio of a quantity of non-light-emitting pixels to all pixels is different along each of the rows versus each of the columns,
wherein a ratio of the quantity of non-light-emitting pixels to total pixels in the transmission cell is in a range from about ½ to about ⅗.

25. The display layer of claim 22,
wherein the circuit element layer has third light-emitting elements of a third emitter type, and the pixel definition layer has third openings defining third light-emitting pixels on the third light-emitting elements,
wherein the first emitter type is configured to emit red light, the second emitter type is configured to emit green light, and the third emitter type is configured to emit blue light,
wherein sizes of the first, second, and third openings are different from each other.

26. The display layer of claim 25,
wherein the size of the first openings is larger than the size of the second openings and smaller than the size of the third openings,
wherein sizes of the sensor openings are greater than or equal to the sizes of at least one of the first, second, or third openings.

27. The display layer of claim 25,
wherein a quantity of the first light-emitting pixels is substantially equal to a quantity of the third light-emitting pixels,
wherein a quantity of the second light-emitting pixels is substantially equal to a sum of the quantity of the first light-emitting pixels and the quantity of the third light-emitting pixels.

28. The display layer of claim 25, further comprising an electronic module including the non-light-emitting elements disposed under a plurality of the non-light-emitting pixels, wherein the sensor type comprises at least three sensor types responsive to at least red light, green light, and blue light, respectively.

29. The display layer of claim 25,
wherein the first openings are oriented substantially the same as each other,
wherein the third openings are oriented substantially the same as each other,
wherein the second openings are oriented in a first direction where disposed on a diagonal of adjacent pixels comprising the first openings, and oriented in a second direction where disposed on a diagonal of adjacent pixels comprising the second openings.

30. The display layer of claim 25,
wherein the second openings are elongated on one axis and oriented with the elongated axis disposed on a diagonal of adjacent first openings.

31. The display layer of claim 24, wherein, in the transmission cell, the light-emitting pixels bound a contiguous group of the non-light-emitting pixels.

* * * * *